(12) United States Patent
Suda et al.

(10) Patent No.: US 7,732,927 B2
(45) Date of Patent: Jun. 8, 2010

(54) SEMICONDUCTOR DEVICE HAVING A INTERLAYER INSULATION FILM WITH LOW DIELECTRIC CONSTANT AND HIGH MECHANICAL STRENGTH

(75) Inventors: Shoichi Suda, Kawasaki (JP); Shino Tokuyo, Kawasaki (JP); Yoshihiro Nakata, Kawasaki (JP); Azuma Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 68 days.

(21) Appl. No.: 11/944,053

(22) Filed: Nov. 21, 2007

(65) Prior Publication Data
US 2008/0122121 A1    May 29, 2008

(30) Foreign Application Priority Data
Nov. 24, 2006    (JP) .............................. 2006-317446

(51) Int. Cl.
*H01L 23/48* (2006.01)

(52) U.S. Cl. ........................ 257/774; 257/499; 257/784; 257/E23.141

(58) Field of Classification Search ................. 257/499, 257/774, 784, E23.141
See application file for complete search history.

(56) References Cited

U.S. PATENT DOCUMENTS
2003/0116854 A1* 6/2003 Ito et al. ...................... 257/761
2005/0124151 A1* 6/2005 Cheng et al. ................ 438/623

FOREIGN PATENT DOCUMENTS
JP    2003-100757 A    4/2003
JP    2004-179386 A    6/2004

* cited by examiner

*Primary Examiner*—Tan N Tran
(74) *Attorney, Agent, or Firm*—Westerman, Hattori, Daniels & Adrian, LLP

(57) ABSTRACT

The method includes the steps of forming a porous insulation film and wires on the substrate, the wires embedded in the porous insulation film having a portion adjacent to the wires and a remote portion spaced apart from the wires; and applying an energy beam to the remote portion to change the structure of the porous insulation film such that an Young's modulus of the porous insulation film increased so as to substantially reinforce the strength of the porous insulation film.

7 Claims, 21 Drawing Sheets

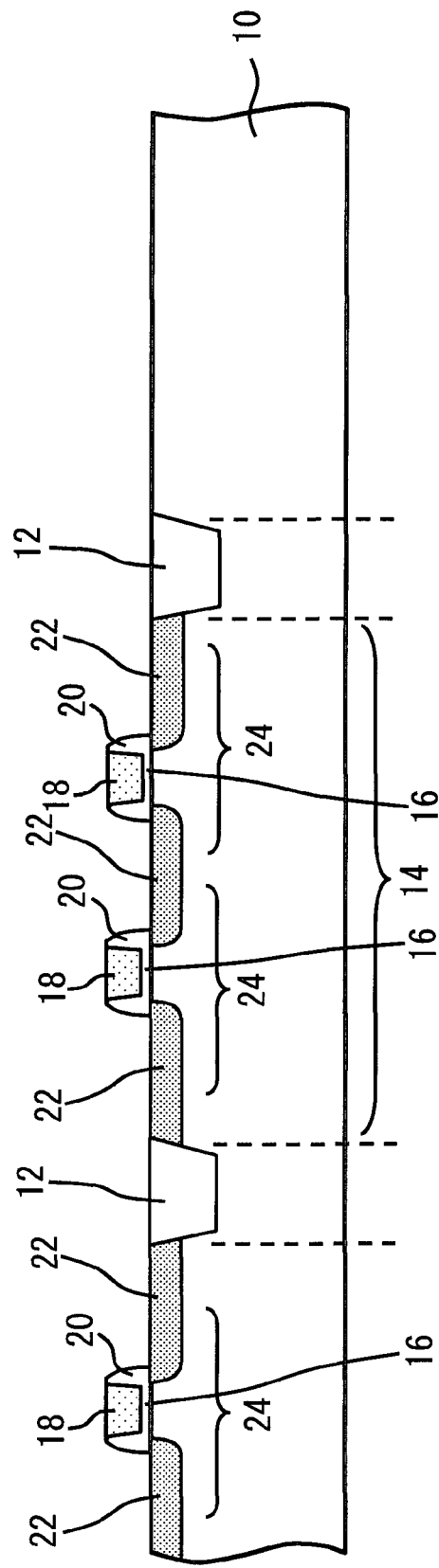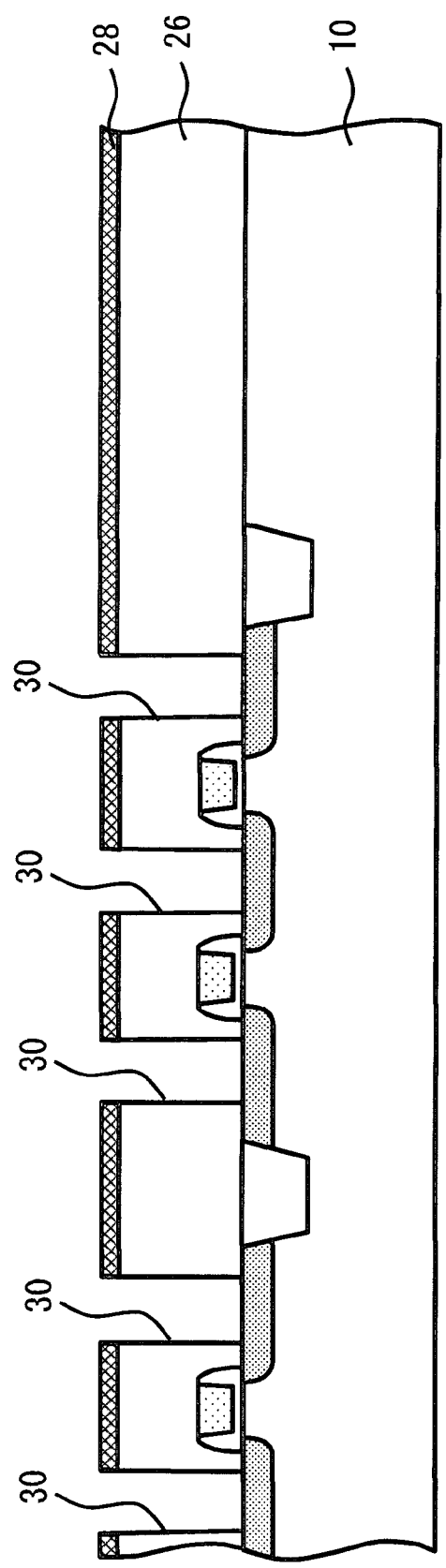

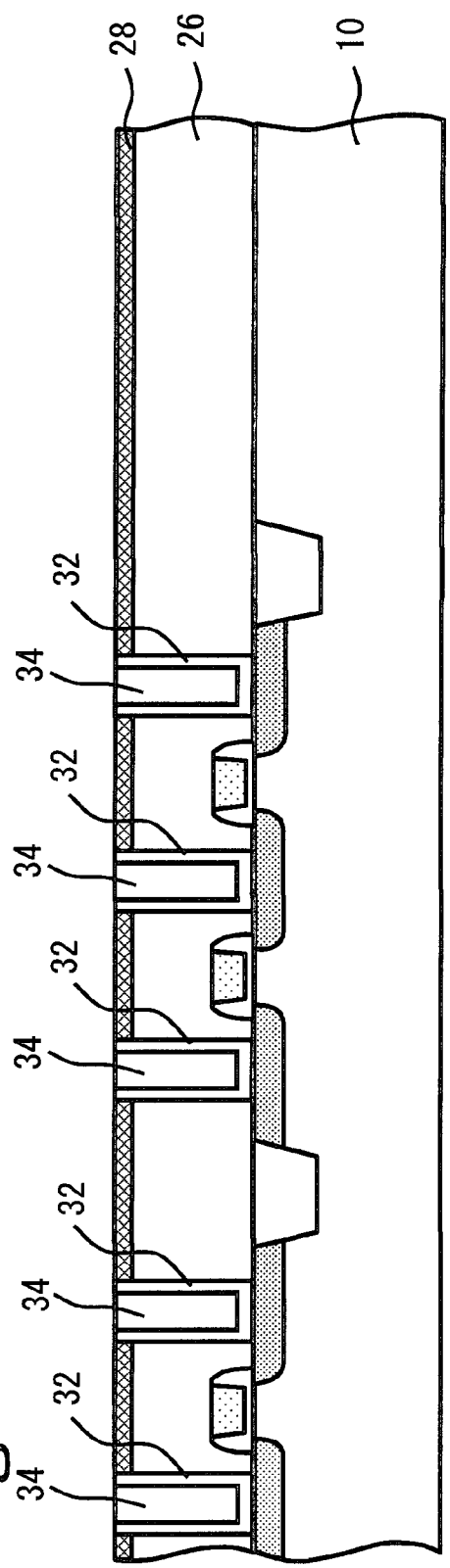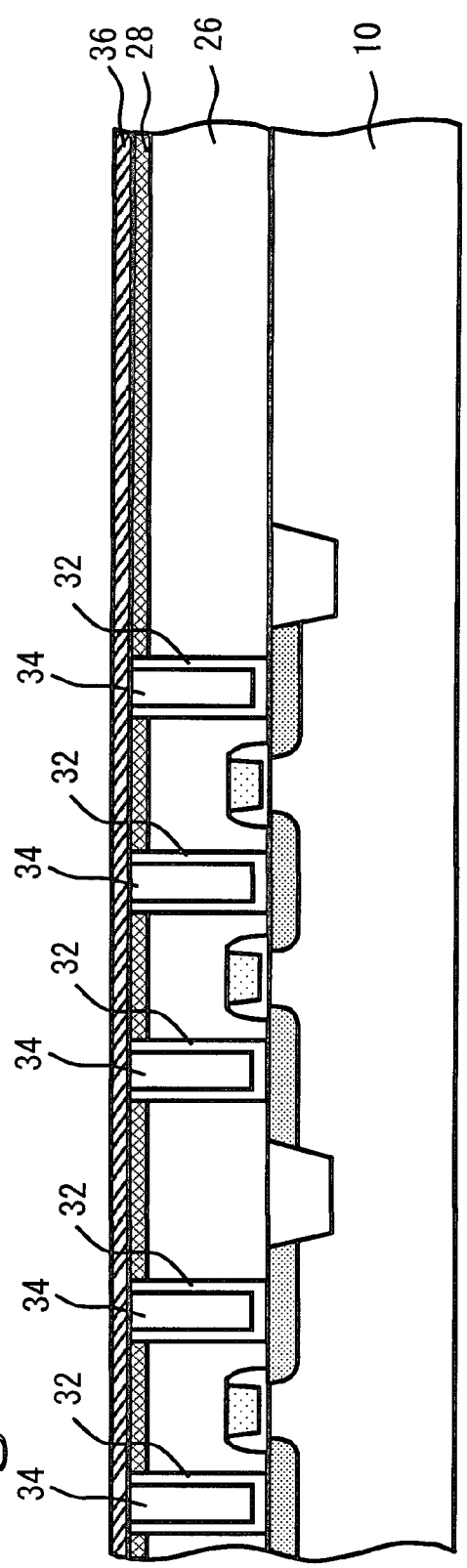

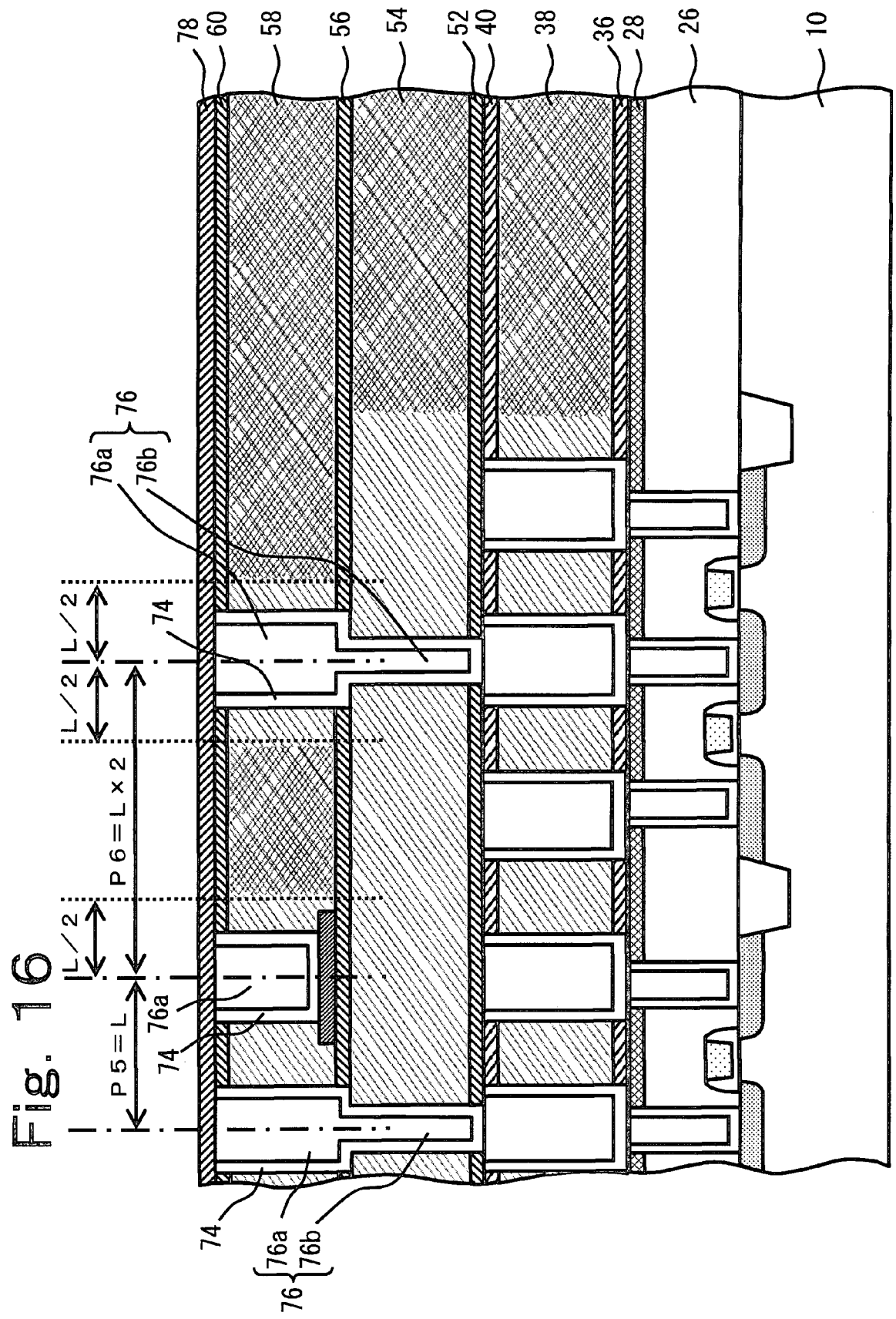

Fig. 17

Table1

| | | Example 1 | Example 2 | Example 3 | Comparative Example |
|---|---|---|---|---|---|
| Interlayer Insulation Film Before Electron Beam Curing Step | Thickness | 210nm | 210nm | 210nm | 210nm |
| | Refractive Index | 1.28 | 1.28 | 1.28 | 1.28 |
| Condition Of Electron Beam Curing Step | Substrate Temperature | 200°C | 300°C | 400°C | — |
| | Acceleration Voltage | 15keV | 15keV | 15keV | — |
| | Time | 300sec | 300sec | 300sec | — |
| | Atmosphere | Argon | Argon | Argon | — |
| Interlayer Insulation Film After Electron Beam Curing Step | Thickness | 194nm | 182nm | 181nm | 210nm |
| | Refractive Index | 1.321 | 1.343 | 1.367 | 1.28 |
| | Elastic Modulus (Young's Modulus) | 13GPa | 14GPa | 16GPa | 8GPa |
| | Relative Dielectric Constant | 2.6 | 3.3 | 3.5 | 2.3 |

Fig. 18

Table2

| | | Example 4 | Example 5 | Example 6 | Comparative Example |
|---|---|---|---|---|---|
| Interlayer Insulation Film Before Ultraviolet Light Curing Step | Thickness | 210nm | 210nm | 210nm | 210nm |
| | Refractive Index | 1.28 | 1.28 | 1.28 | 1.28 |
| Condition Of Ultraviolet Light Curing Step | Substrate Temperature | 200°C | 300°C | 400°C | — |
| | Time | 600sec | 600sec | 600sec | — |
| Interlayer Insulation Film After Ultraviolet Light Curing Step | Thickness | 200nm | 198nm | 199nm | 210nm |
| | Refractive Index | 1.305 | 1.299 | 1.312 | 1.28 |
| | Elastic Modulus (Young's Modulus) | 13GPa | 14GPa | 15GPa | 8GPa |
| | Relative Dielectric Constant | 2.4 | 2.6 | 2.5 | 2.3 |

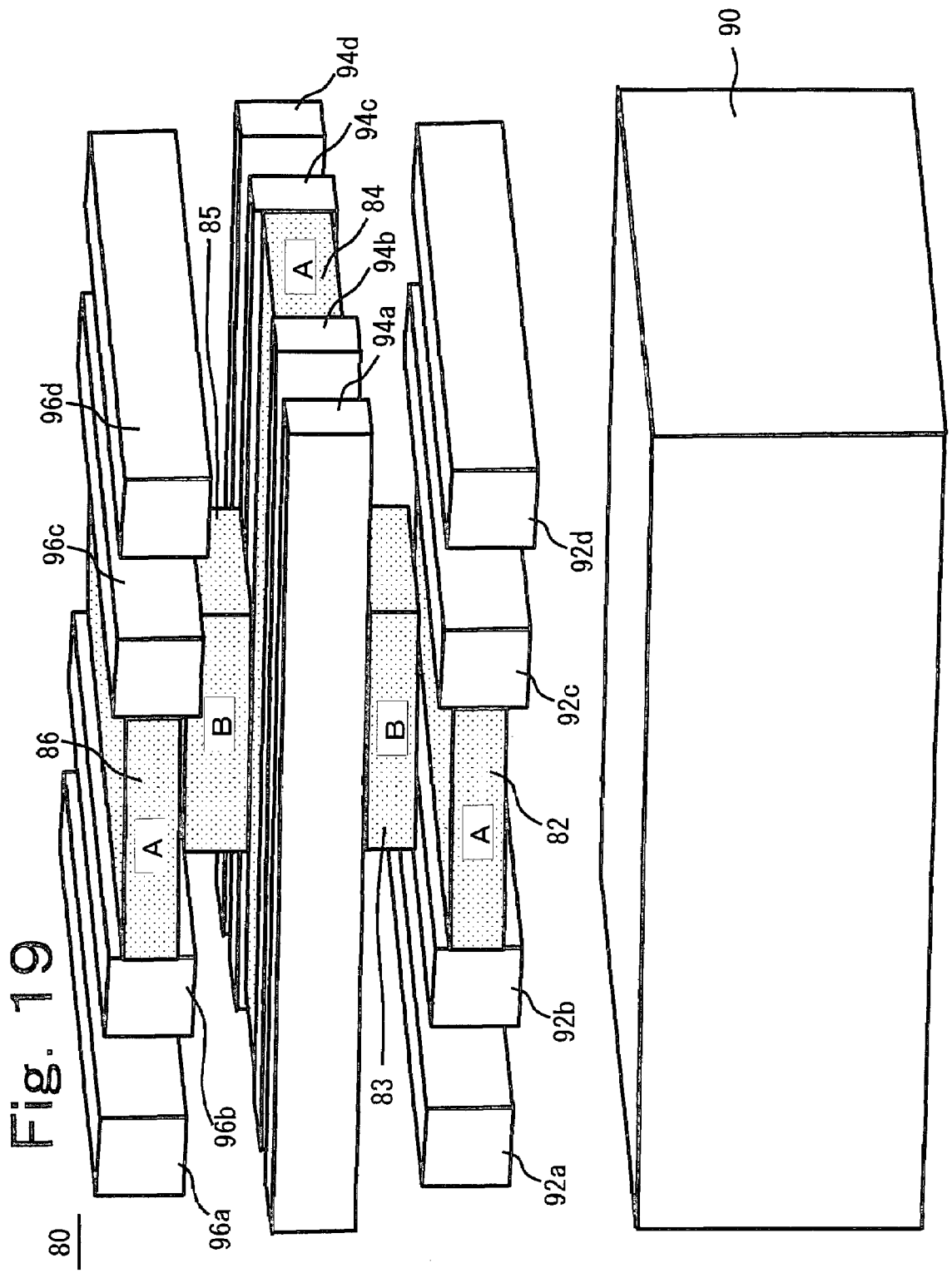

Fig. 21

Table 3

Highest Wiring Densities

|  | Simulation (1) | Simulation (2) | Simulation (3) | Simulation (4) |
|---|---|---|---|---|
|  | A wire is added to the center of the portion A. | No wire is added (as shown in Fig. 20). | No wire is added (as shown in Fig. 20). | No wire is added (as shown in Fig. 20). |
|  | Portion A: NM<br>Portion B: NM | Portion A: NM<br>Portion B: NM | Portion A: M<br>Portion B: NM | Portion A: M<br>Portion B: M |
| Maximum Stress (GPa) | 0.60 | 0.82 | 0.80 | 0.78 |
| Wiring Capacitance Of Wire 94b, 94c (fF/mm) | 172 | 136 | 139 | 140 |

NM: Non Modified, M: Modified

SEMICONDUCTOR DEVICE HAVING A INTERLAYER INSULATION FILM WITH LOW DIELECTRIC CONSTANT AND HIGH MECHANICAL STRENGTH

BACKGROUND OF THE INVENTION

1. Field of the Invention

The present invention relates to semiconductor devices and methods for fabricating the same. More particularly, the invention relates to a semiconductor device which has high mechanical strength despite the use of a material having a low relative dielectric constant for forming insulation films.

2. Description of the Related Art

With recent higher integration of semiconductor devices, wiring width and wiring pitch have been reduced markedly. Since the parasitic capacitance between wires is inversely proportional to the distance between adjacent wires (wiring pitch), a reduction in wiring pitch results in an increase in the parasitic capacitance between wires. The increase in the parasitic capacitance leads to a delay in signal propagation in the wires, which is an inhibiting factor in improving the operating speed of semiconductor devices.

In order to overcome such an "increase in the parasitic capacitance between wires", it is effective to decrease the relative dielectric constant of interlayer insulation films. That is, by using, as the material for interlayer insulation films, a material having a lower relative dielectric constant than materials commonly used, the parasitic capacitance between wires is decreased.

A porous insulation film has been noted as an insulation film having a very low relative dielectric constant. The porous insulation film is a film having many pores therein. If the "porous insulation film" is used as a material for an interlayer insulation film, the parasitic capacitance between wires can be decreased. However, under the influence of many pores present in the film, the mechanical strength of the film is decreased. As a result, it becomes difficult to provide a sufficient mechanical strength required for the device.

Under these circumstances, it has been proposed that a porous insulation film is selectively used in an interlayer insulation film. That is, in an interlayer insulation film, a porous insulation film is used only in an area that does not require strength (refer to Japanese Unexamined Patent Application Publication No. 2003-100757 [Patent Document 1] and Japanese Unexamined Patent Application Publication No. 2004-179386 [Patent Document 2]). Patent Document 1 discloses that a non-porous insulation film is provided in bonding pad forming regions so that the insulation film is not fractured during bonding, and a porous insulation film is provided in regions other than the bonding pad forming regions. Patent Document 2 discloses an example in which an interlayer insulation film having a low dielectric constant and being made of a porous material is provided only in narrow regions between wires, and a usual interlayer insulation film made of silicon dioxide ($SiO_2$) is provided in regions other than the narrow regions.

However, in each of the techniques disclosed in Patent Documents 1 and 2, when an interlayer insulating film is formed, separate steps of forming two films made of different insulating materials (i.e., a porous insulating material and a non-porous insulating material) are required. Thus, the number of steps required for forming the interlayer insulating film is increased.

SUMMARY

In a first aspect, a semiconductor device includes a substrate; a porous insulation film formed on the substrate; and a plurality of wires embedded in the porous insulation film, the porous insulation film having a portion adjacent to the wires and a remote portion spaced apart from the wires, the remote potion having an increased Young's Modulus so as to substantially reinforce the strength of the porous insulation film.

In a second aspect, a method for fabricating a semiconductor device includes the steps of forming a porous insulation film and a plurality of wires on the substrate, the wires embedded in the porous insulation film having a portion adjacent to the wires and a remote portion spaced apart from the wires; and applying an energy beam to the remote portion to change the structure of the porous insulation film such that an Young's modulus of the porous insulation film increased so as to substantially reinforce the strength of the porous insulation film.

BRIEF DESCRIPTION OF THE DRAWINGS

FIGS. 3A and 3B are each a cross-sectional view showing a step in a method for fabricating a semiconductor device (part 1) according to the first embodiment of the present invention;

FIGS. 4A and 4B are each a cross-sectional view showing a step in the method for fabricating the semiconductor device (part 2) according to the first embodiment of the present invention;

FIG. 16 is a cross-sectional view showing a step in the method for fabricating the semiconductor device (part 14) according to the first embodiment of the present invention;

FIG. 17 shows the results of the experiments on modification (of porous insulation films) when the porous insulation films are irradiated with electron beams;

FIG. 18 shows the results of the experiments on modification (of porous insulation films) when the porous insulation films are irradiated with ultraviolet light;

FIG. 19 is a diagram showing a structural model of a semiconductor device;

FIG. 21 shows the results of simulation performed under the conditions shown in FIG. 20.

DESCRIPTION OF THE PREFERRED EMBODIMENTS

Preferred embodiments of the present invention will be described in detail below with reference to the drawings.

First Embodiment

Figure 1:
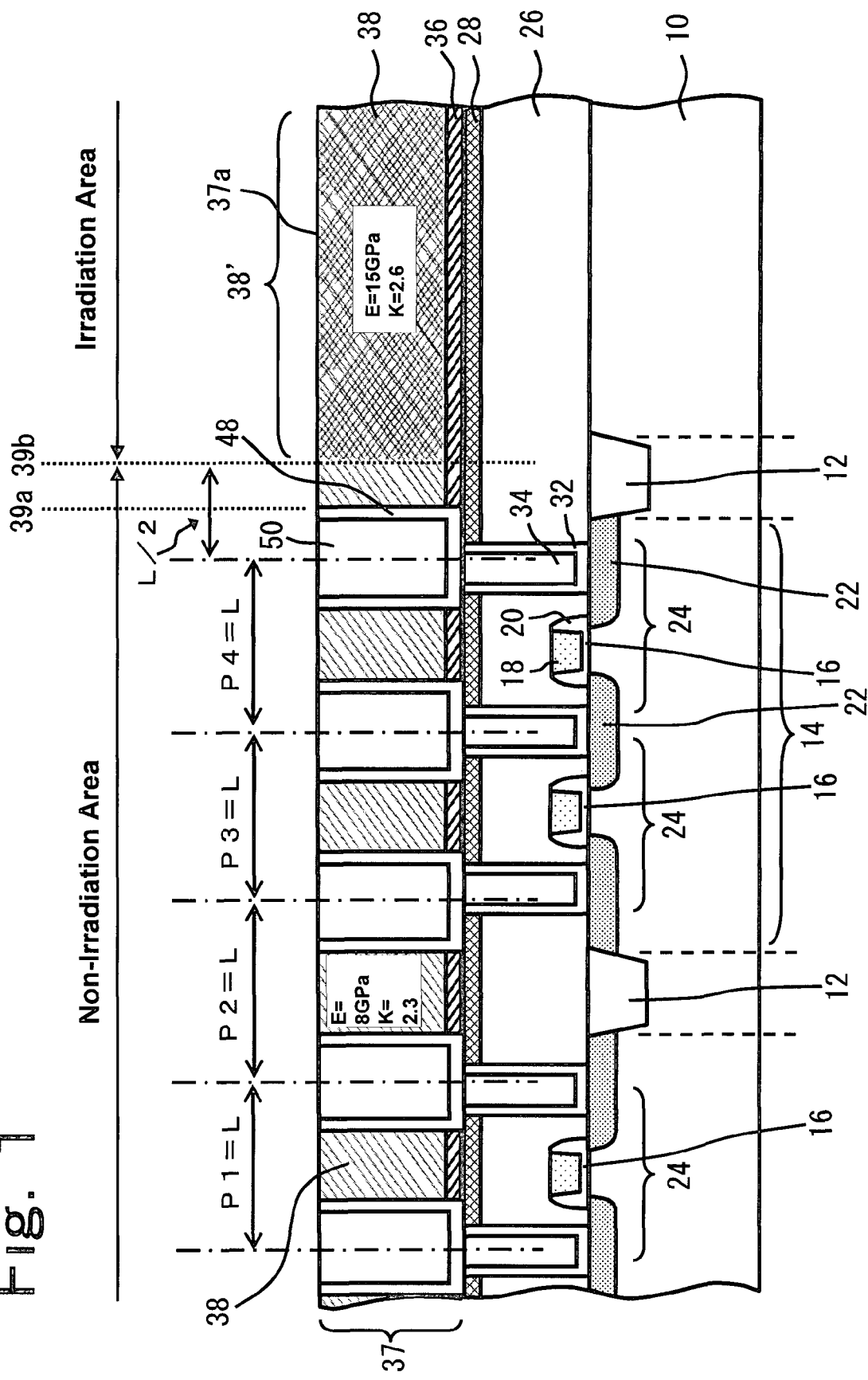
FIG. 1 is a cross-sectional view of a semiconductor device according to a first embodiment of the present invention.

FIG. 1 is a cross-sectional view of a semiconductor device according to a first embodiment of the present invention. As shown in FIG. 1, in the semiconductor device, an interlayer insulation film 26, a stopper film 28, an insulation film 36, and an interlayer insulation film 38 are disposed in that order on a semiconductor substrate 10. Element isolation films 12 are disposed on the semiconductor substrate 10, and transistors 24 are disposed in element regions 14 defined by the element isolation films 12.

Furthermore, adhesion layers 32 and conductor plugs 34 are disposed in the interlayer insulation film 26 and the stopper film 28. Laminated films 48 including barrier films and seed films, and wires 50 are disposed in the insulation film 36 and the interlayer insulation film 38. The wires 50 are, for example, made of copper (Cu). As described above, the wires 50 are disposed in the interlayer insulation film 38, and the interlayer insulation film 38 and the wires 50 constitute one layer (first wiring layer 37).

As shown in FIG. 1, each transistor 24 includes a gate electrode 18 surrounded by a gate insulation film 16 and a sidewall insulation film 20, source/drain diffusion layers 22 formed in the semiconductor substrate 10 (at both sides of the gate electrode 18), etc.

The interlayer insulation film 38 (first insulation film) is, for example, made of porous silicon oxide. The interlayer insulation film 38 includes a modified portion 38' the porous property of which is modified by irradiation of an energy beam, such as an electron beam or ultraviolet light. In the porous interlayer insulation film 38, the Young's modulus E is 8 GPa and the relative dielectric constant K is 2.3. In the modified portion 38', the Young's modulus E is 15 GPa and the relative dielectric constant K is 2.6. That is, the irradiation of the energy beam increases the mechanical strength and the relative dielectric constant. Here, the term "modification" means a change in the structure of a film.

Referring to FIG. 1, one side of a line 39b (the side in which the wires 50 are disposed) corresponds to a "non-irradiation area" which is not irradiated with the energy beam, and the other side of the line 39b corresponds to an "irradiation area" which is irradiated with the energy beam. Specifically, the line 39b delimits a "minimum-pitched wiring area" that includes wires 50 disposed at a minimum wiring pitch (P=L) and spaces between the wires 50 in the wiring layer 37. As described above, in the wiring layer 37, an area with high wiring density (first area) is not irradiated with the energy beam, and an area with low wiring density (second area) is irradiated with the energy beam. In this case, the line 39b corresponds to a boundary line between the first area and the second area.

The wiring density is a ratio of the area occupied by the wires to the cross-sectional area of the wiring layer. Specifically, for example, in a cross section 37a of the wiring layer 37, the ratio of the area occupied by wiring portions (wires 50 and laminated wiring films 48) corresponds to the wiring density. As shown in FIG. 1, the cross section 37a is a plane parallel to a plane exposed when the interlayer insulation film 38 is formed (i.e., a plane parallel to the principal surface of the semiconductor substrate 10). Consequently, for example, at the design stage, one cross section in the wiring layer 37 is divided into a plurality of isometric regions, and the wiring density is calculated for each region. Thus, the "non-irradiation area" can be determined. In such a case, the wiring density is a ratio of the area in which the wiring portion is exposed (wiring area) to the area of one region (total area).

As shown in FIG. 1, for example, the non-irradiation area corresponds to an area obtained by extending the periphery of the "minimum-pitched wiring area" by a distance of a half of the minimum pitch between wires (L/2). Furthermore, the non-irradiation area may be defined as the same area as the "minimum-pitched wiring area". Furthermore, the non-irradiation area may be defined as an area obtained by extending by a predetermined distance in the width direction of the wire 50 from the center of the wire 50 with respect to all wires 50 in the first wiring layer (or the wires in the "minimum-pitched wiring area" in the first wiring layer). Here, the "predetermined distance" may be set to be a half of the minimum pitch between wires (L/2). When the "non-irradiation area" is set with respect to all wires in one layer as described above, it is not necessary to perform the step of specifying a portion of the wiring, and thus the non-irradiation area can be set easily, which is advantageous.

Figure 2:
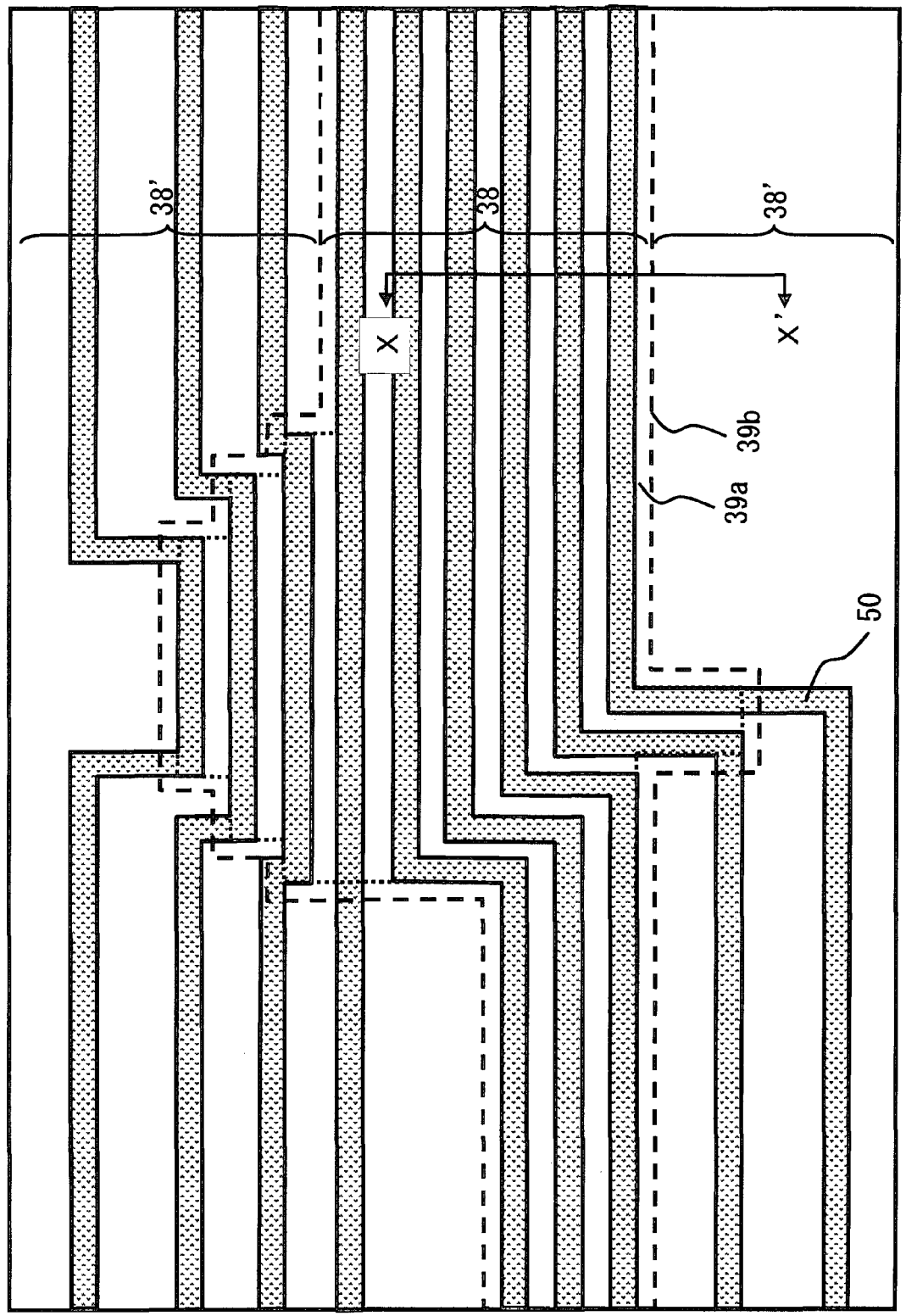
FIG. 2 is a top view showing a first wiring layer of the semiconductor device according to the first embodiment of the present invention.

FIG. 2 is a top view of the first wiring layer shown in FIG. 1. Note that FIG. 1 is a cross-sectional view taken along the line X-X' of FIG. 2. An area inside the line 39b shown in FIG. 2 corresponds to the "non-irradiation area". Here, an area inside a line 39a may be defined as the "non-irradiation area". As described above, the energy beam is applied only to the area with low wiring density (i.e., sparsely wired area) other than the area with high wiring density (i.e., densely wired area).

A method for fabricating a semiconductor device according to the first embodiment of the present invention will now be described in detail with reference to FIGS. 3A to 16. FIGS. 3A to 16 are each a cross-sectional view showing a step in the method for fabricating the semiconductor device according to the first embodiment.

Step 1

As shown in FIG. 3A, element isolation films 12 and transistors 24 are formed in a semiconductor substrate 10. Specifically, for example, the formation is performed in the following manner.

1) First, the element isolation films 12 are formed in the semiconductor substrate 10, for example, by a local oxidation of silicon (LOCOS) process (Step 1-1). The element isolation films 12 define element regions 14. As the semiconductor substrate 10, for example, a silicon substrate is used.

2) Next, the transistors 24 are formed in the element regions 14 (step 1-2). Specifically, gate electrodes 18 are formed on the element regions 14 with a gate insulation film 16 therebetween. Then, sidewall insulation films 20 are formed on the sides of the gate electrodes 18. Subsequently, a dopant impurity is implanted into the semiconductor substrate 10 using the sidewall insulation films 20 and the gate electrodes 18 as masks, and thus source/drain diffusion layers 22 are formed in the semiconductor substrate 10 (at both sides of each gate electrode 18). Thereby, the transistors 24, each having the gate electrode 18 and the source/drain diffusion layers 22, are formed.

Step 2

As shown in FIG. 3B, an interlayer insulation film 26, a stopper film 28, and contact holes 30 are formed. Specifically, for example, the formation is performed in the following manner.

1) First, the interlayer insulation film 26 made of a silicon oxide film is formed, for example, by CVD, over the entire surface of the substrate (step 2-1). The term "entire surface of the substrate" means an entire surface, which is provided with the element isolation films 12 and the transistors 24, of the semiconductor substrate 10. In this embodiment, the semiconductor substrate 10 provided with the insulation films, etc. is, for convenience sake, referred to as the "substrate". One surface of the substrate is referred to as the "surface of the substrate", and the entire surface of one surface of the substrate is referred to as the "entire surface of the substrate".

2) Next, the stopper film 28, for example, with a thickness of 50 nm is formed on the interlayer insulation film 26 (step 2-2). The stopper film 28 may be made of a SiN film, a hydrogenated SiC film (SiC:H film), an oxygen-doped hydrogenated SiC film (SiC:O:H film), a nitrogen-doped SiC film (SiC:N film), or the like, for example, formed by plasma-enhanced CVD. The hydrogenated SiC film is a SiC film in which hydrogen atoms (H) are present. The oxygen-doped hydrogenated SiC film is a SiC film in which oxygen atoms (O) and hydrogen atoms (H) are present. The nitrogen-doped SiC film is a SiC film in which nitrogen atoms (N) are present. The stopper film 28 functions as a stopper when a film (tungsten film) embedded in the contact holes 30 formed in the interlayer insulation film 26 is polished in the step described below. The stopper film 28 also functions as an etching stopper when trenches 46 are formed in the interlayer insulation film 38, etc. in the step described below.

3) Next, using photolithography, the contact holes 30 extending to the source/drain diffusion layers 22 are formed (step 2-3).

Step 3

As shown in FIG. 4A, adhesion layers 32 and conductor plugs 34 are formed. Specifically, for example, the formation is performed in the following manner.

1) First, a film (not shown) for forming the adhesion layers 32 is formed over the entire surface of the substrate, for example, by sputtering (step 3-1). The film is made of TiN with a thickness of 50 nm and ensures adhesion of the conductor plugs 34 and their underlayers (surfaces of the contact holes 30).

2) Next, a tungsten film 34 (not shown), for example, with a thickness of 1 μm is formed over the entire surface of the substrate, for example, by CVD (step 3-2).

3) Next, the film for forming the adhesion layers 32 and the tungsten film 34 are polished, for example, by CMP, until the surface of the stopper film 28 is exposed. Thereby, the adhesion layers 32 are formed in the contact holes and the conductor plugs 34 made of tungsten are embedded in the contact holes.

Step 4

As shown in FIG. 4B, an insulation film 36 made of an oxygen-doped hydrogenated SiC film (SiC:O:H film) is formed. Although a SiC film is a semiconductor, the oxygen-doped hydrogenated SiC film that contains oxygen atoms (O) and hydrogen atoms (H) is an insulator. Thus, the insulation film 36 made of the oxygen-doped hydrogenated SiC film is a highly dense insulation film. The density of the insulation film 36 is higher than that of a porous insulation film 38 which will be described below. The insulation film 36 also functions as a barrier film that prevents diffusion of moisture. Specifically, for example, the formation is performed in the following manner.

1) First, the substrate prepared in step 3 is placed into a chamber of a plasma-enhanced CVD apparatus (not shown) (step 4-1). As the plasma-enhanced CVD apparatus, for example, a parallel-plate-type plasma-enhanced CVD apparatus is used.

2) Next, the temperature of the substrate is increased to 300° C. to 400° C. (step 4-2).

3) Next, a reactive gas is introduced into the chamber (step 4-3). Specifically, first, a siloxane monomer having alkyl groups is vaporized by a vaporizer (not shown) so as to generate the reactive gas. Then, the reactive gas is introduced into the chamber using an inert gas as a carrier. In this stage, when high-frequency power is applied between plate electrodes (not shown), plasma of the reactive gas is generated, and thus the insulation film 36 made of an oxygen-doped hydrogenated SiC film is formed. The feed rate of the reactive gas is, for example, 1 mg/min.

Step 5

Figure 5:
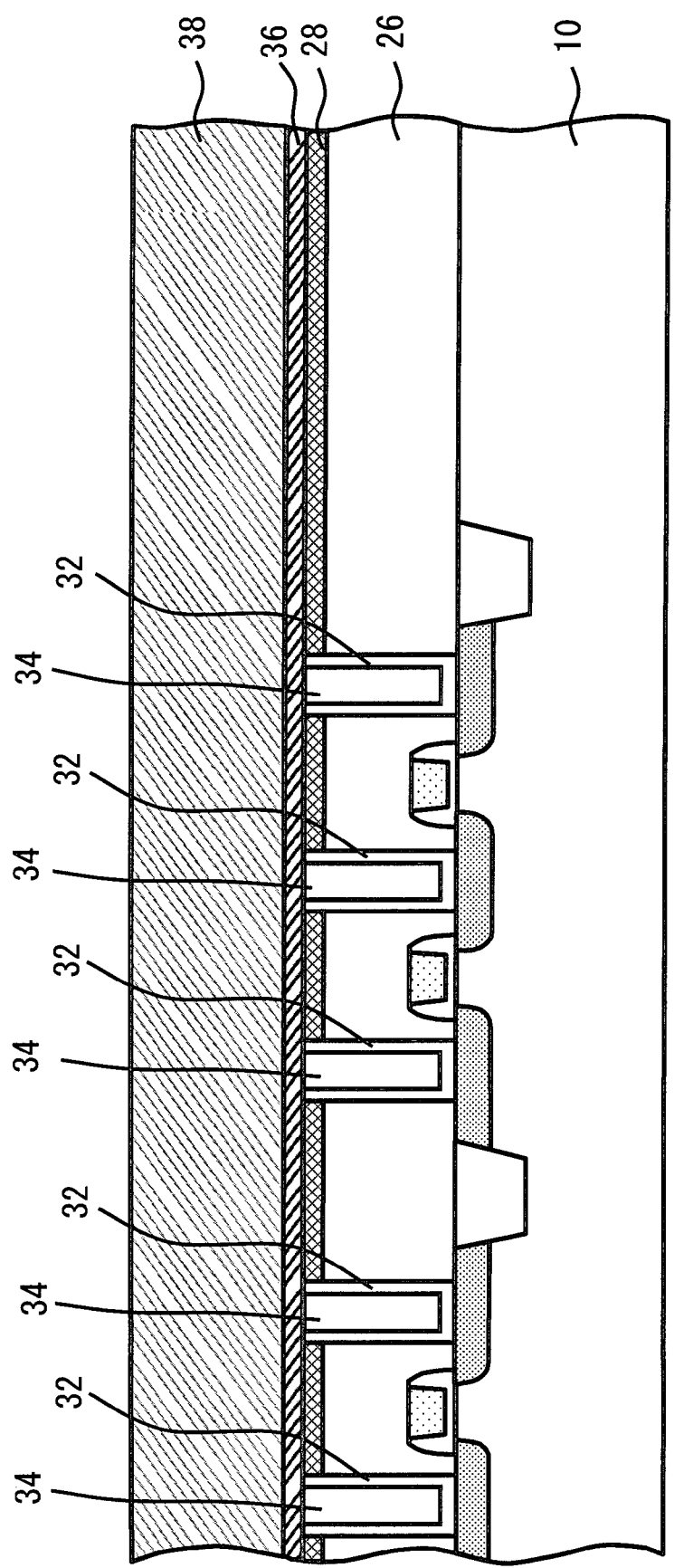
FIG. 5 is a cross-sectional view showing a step in the method for fabricating the semiconductor device (part 3) according to the first embodiment of the present invention.

As shown in FIG. 5, a porous interlayer insulation film (first insulation film) 38 is formed. Examples of the material constituting the porous interlayer insulation film 38 include (A) a porous silicon oxide film, (B) a porous silicon oxide film containing carbon, (C) an organic compound, and (D) a silicon cluster-containing insulating material. The formation methods using these materials will be described below in sequence.

(A) Interlayer Insulation Film Made of Porous Silicon Oxide Film (Porous SiO$_2$ Film)

The thickness of the porous interlayer insulation film 38 is, for example, 160 nm. Specifically, for example, the formation is performed in the following manner.

1) First, an insulation film material for forming the porous interlayer insulation film 38 is prepared (step 5A-1). Examples of the starting material to be used include tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, and propylvinyldialkoxysilane. The starting material is subjected to hydrolysis or polycondensation to give a polymer, and a thermally decomposable compound is added to the resulting polymer to obtain a liquid insulation film material. As the thermally decomposable compound, for example, an acrylic resin or the like is used.

2) Next, the insulation film material obtained in step 5-1 is applied to the entire surface of the substrate, for example, by spin-coating (step 5-2). The spin-coating is performed, for example, at 3,000 rpm for 30 seconds.

3) Next, heat treatment (soft bake process) is performed (step 5-3). In the heat treatment, for example, a hot plate (not shown) is used. The thermally decomposable compound is thermally decomposed by this treatment, and pores (voids) are formed in the interlayer insulation film 38. The diameter of the pores is, for example, about 10 to 20 nm. The heat treatment temperature is set at 200° C. to 350° C. The reason for setting the heat treatment temperature at 200° C. to 350° C. is as follows.

When the heat treatment temperature is set lower than 200° C., the thermally decomposable compound is not sufficiently thermally decomposed, and pores are not formed sufficiently. Furthermore, when the heat treatment temperature is set lower than 200° C., the thermal decomposition rate of the thermally decomposable compound is very slow, and a long period of time is required for forming pores. On the other hand, when the heat treatment temperature is set higher than 350° C., curing of the insulation film material advances rapidly, and the formation of pores is inhibited. For this reason, it is preferably to set the heat treatment temperature at 200° C. to 350° C. Here, the heat treatment temperature is set, for example, at 200° C. Thereby, the interlayer insulation film 38 made of the porous silicon oxide film is formed over the entire surface of the substrate.

(B) Interlayer Insulation Film Made of Porous Silicon Oxide Film Containing Carbon (Porous Carbon-Doped $SiO_2$ Film)

Specifically, for example, the formation is performed in the following manner.

1) First, the semiconductor substrate 10 is placed into a chamber of a plasma-enhanced CVD apparatus (not shown) (step 5B-1). As the plasma-enhanced CVD apparatus, for example, a parallel-plate-type plasma-enhanced CVD apparatus is used.

2) Next, the temperature of the substrate is set, for example, at 300° C. to 400° C. (step 5B-2).

3) Next, a reactive gas is introduced into the chamber (step 5B-3). Specifically, first, a siloxane monomer having alkyl groups is vaporized by a vaporizer (not shown) so as to generate the reactive gas. Then, the reactive gas is introduced into the chamber using a carrier gas. In this stage, when high-frequency power is applied between plate electrodes (not shown), plasma of the reactive gas is generated. By setting the deposition rate relatively high, the porous interlayer insulation film 38 can be formed.

For example, under the following deposition conditions, the porous interlayer insulation film 38 can be formed. As the reactive gas, for example, hexamethyldisiloxane is used. The feed rate of the reactive gas is, for example, 3 mg/min. As the carrier gas, $CO_2$ is used. The flow rate of the carrier gas is, for example, 6,000 sccm. The high-frequency power applied between plate electrodes is, for example, 13.56 MHz (500 W) and 100 kHz (500 W). Thereby, the porous interlayer insulation film 38 made of silicon oxide film containing carbon is formed.

Furthermore, the interlayer insulation film 38 made of a porous silicon oxide film containing carbon may be formed using a starting material containing thermally decomposable atomic groups (thermally decomposable compound) or oxidatively decomposable atomic groups (oxidatively decomposable compound) as will be described below. In this method, the film is formed with the thermally decomposable or oxidatively decomposable atomic groups being decomposed by plasma.

1) First, the semiconductor substrate 10 is placed into a chamber of a plasma-enhanced CVD apparatus (not shown) (step 5B'-1). As the plasma-enhanced CVD apparatus, for example, a parallel-plate-type plasma-enhanced CVD apparatus is used.

2) Next, the temperature of the substrate is set, for example, at 250° C. to 350° C. (step 5B'-2).

3) Next, reactive gases are introduced into the chamber (step 5B'-3). Specifically, first, a siloxane monomer having alkyl groups is vaporized by a vaporizer so as to generate a first reactive gas. A silane compound containing phenyl groups is vaporized by a vaporizer so as to generate a second reactive gas. The phenyl group is an atomic group (thermally decomposable and oxidatively decomposable atomic group) which is decomposed when subjected to an oxidation reaction under heating. Then, these reactive gases are introduced into the chamber using $CO_2$ gas as a carrier gas. In this stage, when high-frequency power is applied between plate electrodes (not shown), the $CO_2$ gas is converted into plasma (oxygen plasma) to decompose the phenyl groups. Since the interlayer insulation film 38 is deposited with the phenyl groups being decomposed, the porous interlayer insulation film 38 is formed.

Deposition conditions are set, for example, as follows. As the first reactive gas, more specifically, for example, hexamethyldisiloxane is used. The feed rate of the first reactive gas is, for example, 1 mg/min. As the second reactive gas, more specifically, for example, diphenylmethylsilane is used. The feed rate of the second reactive gas is, for example, 1 mg/min. The flow rate of the carrier gas is, for example, 3,000 sccm. The high-frequency power applied between plate electrodes is, for example, 13.56 MHz (300 W) and 100 kHz (300 W). Thereby, the interlayer insulation film 38 made of the porous silicon oxide film containing carbon is formed.

The example in which a material that is decomposed when subjected to oxidation under heating (material containing thermally decomposable and oxidatively decomposable atomic groups) has been described above. However, the porous interlayer insulation film 38 may be formed by vapor deposition using a starting material containing atomic groups that can be thermally decomposed without being oxidized or a starting material containing atomic groups that can be oxidatively decomposed without being heated.

(C) Porous Interlayer Insulation Film Made of Organic Compound (Porous Organic Film)

Specifically, for example, the formation is performed in the following manner.

1) First, a polyaryl ether polymer containing a thermally decomposable organic compound is diluted with a solvent to form an insulation film material (step 5C-1). As the thermally decomposable organic compound, an organic compound that is thermally decomposed, for example, at 200° C. to 300° C. is used. Examples of such an organic compound include acrylic resins, polyethylene resins, polypropylene resins, acrylic oligomers, ethylene oligomers, and propylene oligomers. As the solvent, for example, cyclohexanone is used.

2) Next, the insulation film material prepared in step 5C-1 is applied to the entire surface of the substrate by spin-coating (step 5C-2).

3) Next, heat treatment is performed using a hot plate (not shown) (step 5C-3). The heat treatment temperature is, for example, 100° C. to 400° C. Thereby, the solvent in the interlayer insulation film 38 is vaporized, and a dry interlayer insulation film 38 is obtained.

4) Then, the substrate obtained in step 5C-3 is placed into a curing oven (not shown) to perform heat treatment (step 5C-4). The heat treatment temperature is, for example, 300° C. to 400° C. Thereby, the thermally decomposable organic compound is thermally decomposed, and pores are formed in the interlayer insulation film 38.

(D) Porous Interlayer Insulation Film Made of Silicon Cluster-Containing Insulating Material Specifically, for example, the formation is performed in the following manner.

1) First, an insulation film material containing clusters of silica (silica cluster precursor) is prepared (step 5D-1). As such an insulation film material, for example, Nano-Clustering Silica (NCS) (type: CERAMATE NCS) manufactured by Catalysts & Chemicals Ind. Co., Ltd. can be used.

2) Next, the insulation film material is applied to the entire surface of the substrate by spin-coating (step 5D-2). The spin-coating is performed, for example, at 3,000 rpm for 30 seconds.

3) Next, heat treatment (soft bake process) is performed (step 5D-3). In the heat treatment, for example, a hot plate (not shown) is used. The heat treatment temperature is, for example, 200° C., and the heat treatment time is, for example, 150 seconds. Thereby, the solvent in the insulation film material is vaporized, and the porous interlayer insulation film 38 is formed. Since the interlayer insulation film 38 is formed using the insulation film material containing clusters of silica, the porous interlayer insulation film 38 having fine pores is formed. Specifically, the diameter of the pores is, for example, 2 nm or less. Furthermore, since the interlayer insulation film 38 is formed using the insulation film material containing clusters of silica, the distribution of pores is highly uniform. By forming the interlayer insulation film 38 using the insulation film material containing clusters of silica, it is possible to form a porous interlayer insulation film 38 having very good quality. Thus, the porous interlayer insulation film made of the silicon cluster-containing insulating material can be formed.

Here, the example in which the insulation film material containing a silicon compound as a cluster compound has been described. However, the cluster compound is not limited to the silicon compound.

Step 6

Figure 6:
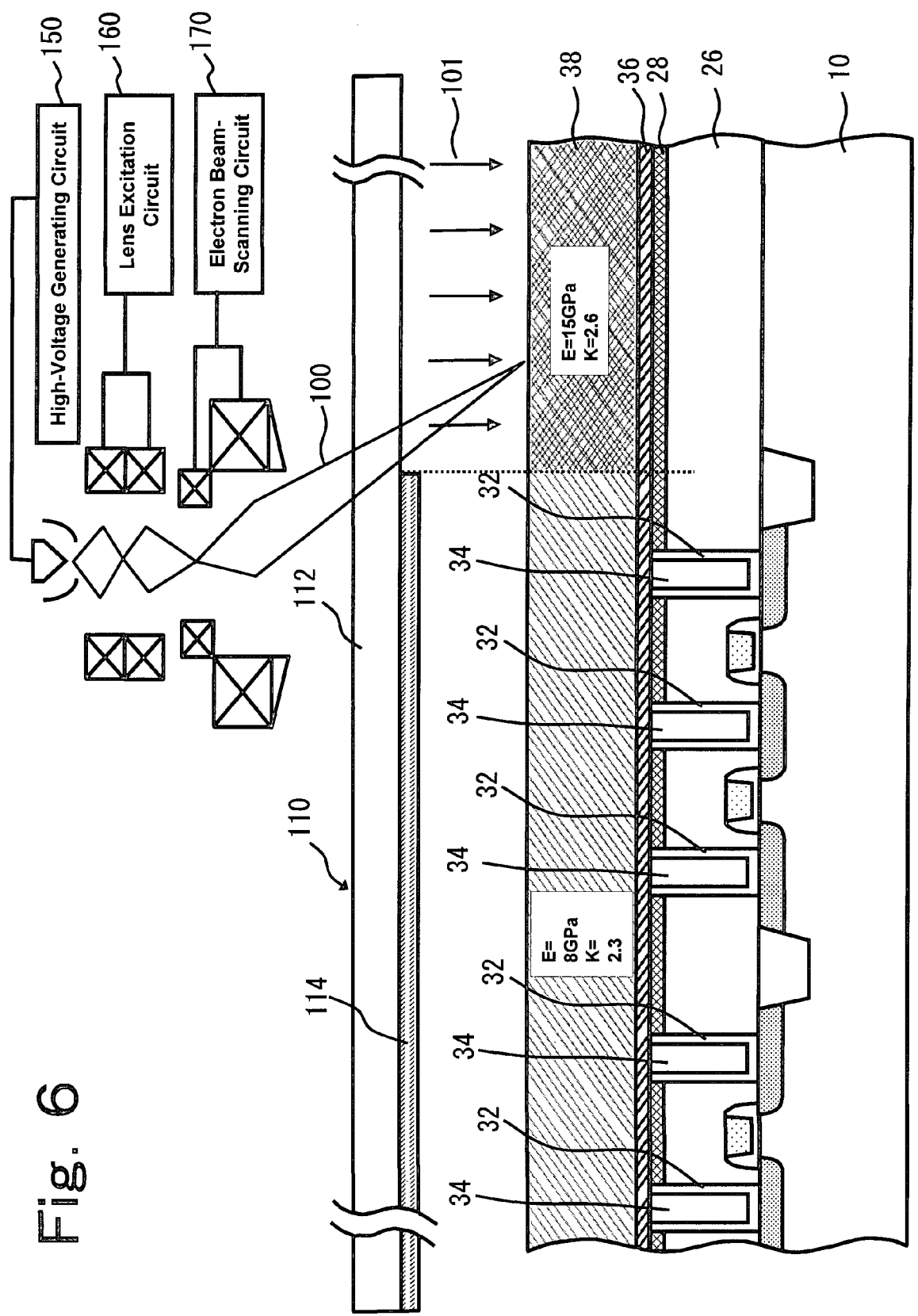
FIG. 6 is a cross-sectional view showing a step in the method for fabricating the semiconductor device (part 4) according to the first embodiment of the present invention.

As shown in FIG. 6, the porous insulation film 38 is selectively irradiated with an energy beam. As the energy beam, for example, an electron beam, ultraviolet light, or the like can be used. The irradiation of electron beam (A) and the irradiation of ultraviolet light (B) are performed as follows.

(A) Irradiation of Electron Beam

1) First, the semiconductor device 10 formed in step 5 is placed into a chamber of an electron beam irradiation apparatus (not shown) (step 6A-1).

2) Next, the chamber is evacuated to obtain a vacuum state (step 6A-2). At this stage, to adjust the pressure in the chamber or to modify the insulation film 40, etc., a gas may be introduced into the chamber. As the gas to be introduced into the chamber, for example, nitrogen gas, argon gas, helium gas, methane gas, or ethane gas can be used.

3) Next, the porous insulation film 38 is selectively irradiated with an electron beam 100 (step 6A-3). For example, as shown in FIG. 6, scanning with the electron beam 100 is performed using a high-voltage generating circuit 150, a lens excitation circuit 160, an electron beam-scanning circuit 170, etc., so that the porous insulation film 38 is selectively irradiated with the electron beam 100.

When the electron beam 100 is applied to the porous insulation film 38, the portion of the porous interlayer insulation film 38 irradiated with the electron beam 100 is cured to lose the porous property. Specifically, pores present in the porous interlayer insulation film 38 disappear, and the mechanical strength is increased by the disappearance of the pores. On the other hand, the phenomenon of disappearance of pores leads to an increase in the relative dielectric constant of the interlayer insulation film 38. Consequently, in this embodiment, the electron beam 100 is selectively applied only to the "portion with low wiring density" other than the portion in which it is not necessary to increase the mechanical strength (portion with high wiring density) in the interlayer insulation film 38.

Specifically, a portion in which the distance between wires is minimum in the device (or in the wiring layer where the wires are present) is identified, and the identified portion and its surrounding portion are specified as a "non-irradiation area". The electron beam 100 is applied only to the area other than the "non-irradiation area".

The "non-irradiation area" is defined as the same as that described with reference to FIG. 1. That is, among wires 50 in the interlayer insulation film 38, a portion in which the wiring pitch P is minimum (P=L) is identified. The identified wiring portion combined with the spaces between the wires is defined as the "minimum-pitched wiring area". In this case, the non-irradiation area, for example, corresponds to an area obtained by extending the periphery of the minimum-pitched wiring area" by a predetermined distance. The "predetermined distance" may be set, for example, at a half of the minimum pitch between wires (L/2).

Furthermore, the non-irradiation area may be set as shown in FIGS. 1 and 6. That is, the "minimum-pitched wiring area" is extended by a distance of L/2 from the center of the outermost wire, and the extended area is set as the non-irradiation area. Note that the non-irradiation area may be set as the same as the "minimum-pitched wiring area".

Furthermore, the non-irradiation area may be set as an area including all the wires 50 in the first wiring layer and its surrounding area. Specifically, the non-irradiation area is defined as an area obtained by extending by a "predetermined distance" in the width direction of the wires 50 from the center of the wires 50 with respect to all wires 50 in the first wiring layer. (Hereinafter, the "predetermined distance" is, for convenience sake, referred to as the "non-irradiation width".) Here, the "non-irradiation width" can be set, for example, at a half of the minimum pitch between wires (L/2). When the "non-irradiation area" is set with respect to all wires in one layer as described above, it is not necessary to perform the step of specifying a portion of the wiring, and thus the non-irradiation area can be set easily, which is advantageous.

Furthermore, the "non-irradiation area" may be set as an area obtained by extending, by the non-irradiation width from the center of the wire 50 in the width direction of the wire 50, the "identified wiring portion". In such a case, it is also possible to set the non-irradiation width, for example, at a value of L/2. From the standpoint of avoiding finely subdividing the non-irradiation area, the non-irradiation width is preferably set at a value equal to or larger than L/2.

As described above, since the electron beam is not applied to the portion in which the dielectric constant must be low (densely wired portion) in the porous interlayer insulation film 38, the porous state is not modified, and the low dielectric constant is maintained.

Preferably, the electron beam 100 is applied while performing heat treatment. The heat treatment temperature is, for example, 200° C. to 450° C. When the electron beam 100 is applied while performing heat treatment, curing of the interlayer insulation film 38 is promoted, and the mechanical strength of the porous interlayer insulation film 38 can be improved.

The acceleration voltage in the irradiation with the electron beam 100 is, for example, 10 to 20 keV. When the acceleration voltage is lower than 10 keV, it takes a long period of time for the porous interlayer insulation film 38 to be cured. When the acceleration voltage is higher than 20 keV, the porous interlayer insulation film 38 is greatly damaged. As a result, the hygroscopicity of the porous interlayer insulation film 38 may be increased, or the porous interlayer insulation film 38 may be shrunk, resulting in an unnecessary increase in the relative dielectric constant and degradation in flatness. Consequently, the acceleration voltage for the irradiation with the electron beam 100 is preferably about 10 to 20 keV.

The acceleration voltage for the irradiation with the electron beam 100 is not limited to 10 to 20 keV. When a certain period of time is allowed for the porous interlayer insulation film 38 to be cured, the acceleration voltage may be set lower than 10 keV. Even when the acceleration voltage is set higher than 20 keV, by setting the irradiation time of the electron beam 100 shorter, the porous interlayer insulation film 38 can be prevented from being damaged excessively. Thus, even when the acceleration voltage is set higher than 20 keV, by setting the irradiation time of the electron beam 100 shorter, it is possible to prevent an increase in the hygroscopicity of the porous interlayer insulation film 38 and to prevent the shrinkage of the porous interlayer insulation film 38.

(B) Irradiation of Ultraviolet Light

1) First, the semiconductor device 10 is placed into a chamber provided with an ultraviolet lamp (not shown) (step 6B-1). As the ultraviolet lame, for example, a high-pressure mercury lamp is used.

2) Next, the chamber is evacuated to obtain a vacuum state (step 6B-2). At this stage, to adjust the pressure in the chamber or to modify the insulation film 40, etc., a gas may be introduced into the chamber. As the gas to be introduced into the chamber, for example, nitrogen gas or inert gas is used. As the inert gas, for example, argon gas is used.

3) Next, the porous insulation film 38 is selectively irradiated with ultraviolet light 101 (step 6B-3). In the irradiation with ultraviolet light 101, for example, a photomask 110 as shown in FIG. 6 is used. The photomask 110, for example, has a structure in which a glass plate 112 is partially covered with a chrome pattern 114. The ultraviolet light 101 is selectively applied through the photomask 110 to the exposed surface of the porous insulation film 38 in such a manner. When the ultraviolet light 101 is applied to the porous interlayer insulation film 38, the portion of the porous interlayer insulation film 38 irradiated with the ultraviolet light 101 is cured to lose the porous property.

Specifically, pores present in the porous interlayer insulation film 38 disappear, and the mechanical strength is increased by the disappearance of the pores. On the other hand, the phenomenon of disappearance of pores leads to an increase in the relative dielectric constant of the interlayer insulation film 38. Consequently, in this embodiment, the ultraviolet light 101 is selectively applied only to the "portion with low wiring density" other than the portion in which it is not necessary to increase the mechanical strength (portion with high wiring density) in the interlayer insulation film 38.

The area to which the ultraviolet light 101 is applied is set in the same manner as in step 6A-3 described above.

Preferably, the ultraviolet light 101 is applied to the porous interlayer insulation film 38 while performing heat treatment. The heat treatment temperature is, for example, 200° C. to 450° C. When the ultraviolet light 101 is applied while performing heat treatment, curing of the interlayer insulation film 38 is promoted, and the mechanical strength of the interlayer insulation film 38 can be improved.

Although the example in which irradiation of the ultraviolet light 101 is performed in a vacuum state has been described above, the pressure during the irradiation of the ultraviolet light 101 is not limited to the vacuum. For example, irradiation of the ultraviolet light 101 may be performed at normal pressure.

As described above, by the selective irradiation of the interlayer insulation film 38 with the energy beam, with respect to the interlayer insulation film 38 including the wiring, the mechanical strength is made uniform and the wiring capacitance is also made uniform.

In FIG. 6, for convenience sake, the means for irradiation of the electron beam 100 and the means for irradiation of the ultraviolet light 101 are both shown. However, when the irradiation of the energy beam is performed, either one of these means is used. In the drawings subsequent to FIG. 6, for convenience sake, the means for irradiation of the electron beam 100 is omitted, and the means for irradiation of the ultraviolet light 101 only is shown.

Step 7

Figure 7:
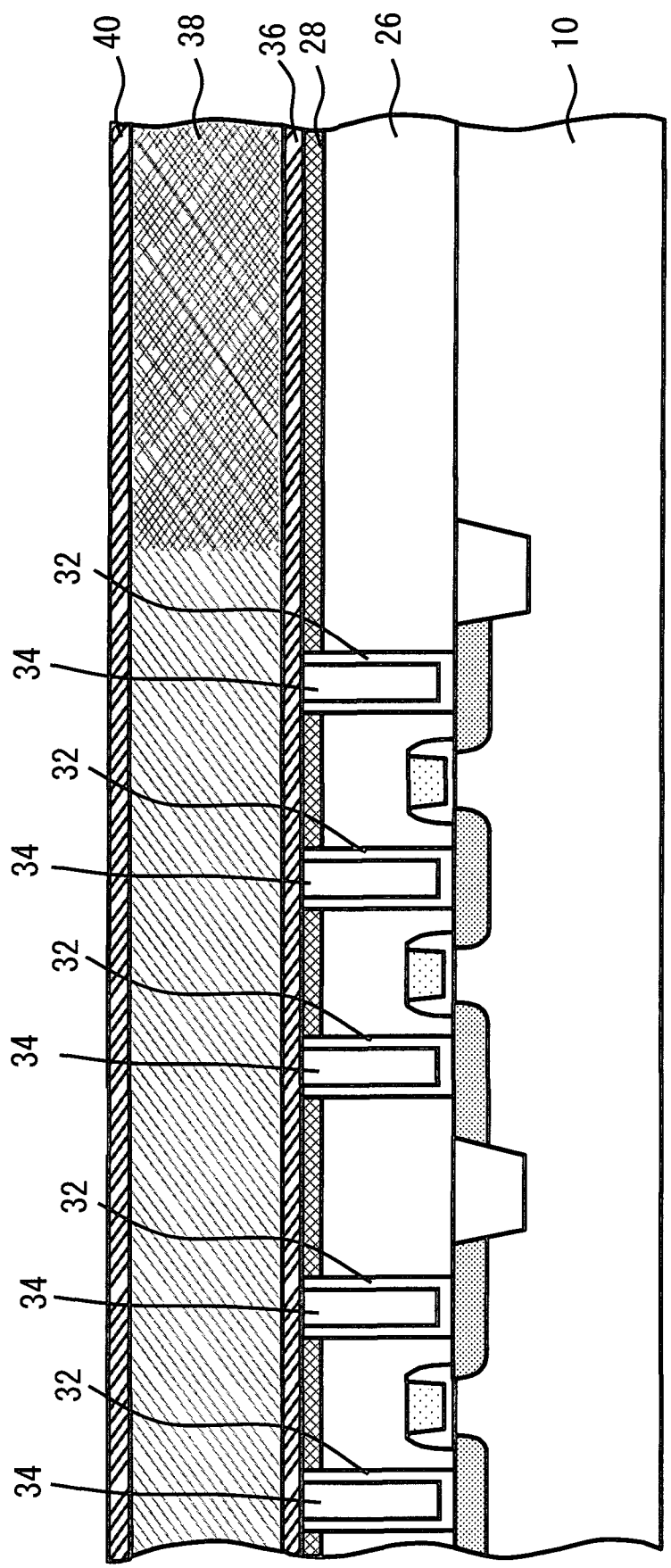
FIG. 7 is a cross-sectional view showing a step in the method for fabricating the semiconductor device (part 5) according to the first embodiment of the present invention.

As shown in FIG. 7, a highly dense insulation film (second insulation film) 40 is formed over the entire surface of the semiconductor substrate 10 provided with the porous interlayer insulation film 38. Examples of the method for forming the insulation film 40 include (A) a film formation method by plasma-enhanced CVD, (B) a film formation method by vapor-phase growth, and (C) a film formation method by spin-coating. These film formation methods will be described below in sequence.

(A) Film Formation Method by Plasma-Enhanced CVD

A method for forming the insulation film 40 made of a silicon oxide film using plasma-enhanced CVD will be described below.

1) First, the semiconductor substrate 10 is placed into a chamber of a plasma-enhanced CVD apparatus (not shown) (step 7A-1). As the plasma-enhanced CVD apparatus, for example, a parallel-plate-type plasma-enhanced CVD apparatus is used.

2) Next, the temperature of the substrate is set, for example, at 400° C. (step 7A-2).

3) Next, a reactive gas is introduced into the chamber (step 7A-3). Specifically, first, trimethylsilane is vaporized by a vaporizer (not shown) so as to generate the reactive gas. Then, the reactive gas is introduced into the chamber using an inert gas as a carrier. In this stage, when high-frequency power is applied between plate electrodes (not shown), plasma of the reactive gas is generated.

In this stage, by setting the deposition rate relatively low, it is possible to form a highly dense insulation film 40. Specifically, for example, under the deposition conditions described below, it is possible to form the highly dense insulation film 40. The feed rate of the reactive gas is, for example, 1 mg/min. As the inert gas as the carrier, for example, $CO_2$ is used. The flow rate of the inert gas is, for example, 100 sccm. The high-frequency power applied between plate electrodes is, for example, 13.56 MHz (200 W) and 100 kHz (200 W). The time for applying high-frequency power between plate electrodes to generate plasma is, for example, 5 seconds.

When the insulation film 40 made of the silicon oxide film is formed under the conditions described above, the density of the insulation film 40 is, for example, about 2 g/cm$^3$. Here, the thickness of the insulation film 40 is set, for example, at 30 nm. Thereby, the insulation film 40 composed of the silicon oxide film is formed.

Furthermore, as the insulation film 40, a carbon-doped silicon oxide film may be formed. In order to form the carbon-doped silicon oxide film (carbon-doped $SiO_2$ film), in step 7A-3 described above, as the starting material for generating the reactive gas, hexamethyldisiloxane ($[(CH_3)_3Si]_2O$) is used. That is, hexamethyldisiloxane is vaporized by a vaporizer (not shown) so as to generate the reactive gas. Since the procedure other than the use of hexamethyldisiloxane as the starting material for generating the reactive gas is the same as that according to steps 7A-1 to 7A-3, a description thereof will be omitted.

(B) Film Formation Method by Vapor-Phase Growth

A method for forming the insulation film 40 made of a hydrogenated SiC film (SiC:H film) will be described below.

1) First, the semiconductor substrate 10 is placed into a chamber of a plasma-enhanced CVD apparatus (not shown). As the plasma-enhanced CVD apparatus, for example, a parallel-plate-type plasma-enhanced CVD apparatus is used (step 7B-1).

2) Next, the temperature of the substrate is set, for example, at 400° C. (step 7B-2).

3) Next, a reactive gas is introduced into the chamber (step 7B-3). Specifically, first, trimethylsilane is vaporized by a vaporizer (not shown) so as to generate the reactive gas. Then, the reactive gas is introduced into the chamber using a carrier gas. In this stage, when high-frequency power is applied between plate electrodes (not shown), plasma of the reactive gas is generated.

In this stage, by setting the deposition rate relatively low, it is possible to form a highly dense insulating film 40. Specifically, for example, under the deposition conditions described below, it is possible to form the highly dense insulating film 40. The feed rate of the reactive gas is, for example, 1 mg/min. As the inert gas as the carrier, for example, nitrogen ($N_2$) is used. The flow rate of the inert gas is, for example, 1,000 sccm. The high-frequency power applied between plate electrodes is, for example, 13.56 MHz (200 W) and 100 kHz (200 W). The time for applying high-frequency power between plate electrodes to generate plasma is, for example, 5 seconds.

Furthermore, as the insulation film 40, a nitrogen-doped SiC film may be formed. In order to form the nitrogen-doped SiC film, in step 7B-3 described above, ammonia ($NH_3$) is used as the inert gas. Since the procedure other than the use of ammonia as the inert gas is the same as that according to steps 7B-1 to 7B-3, a description thereof will be omitted.

Furthermore, as the insulation film 40, an oxygen-doped hydrogenated SiC film (SiC:O:H film) may be formed. The oxygen-doped hydrogenated SiC film is a SiC film in which oxygen atoms (O) and hydrogen atoms (H) are present. In order to form the oxygen-doped hydrogenated SiC film, in step 7B-3 described above, carbon dioxide ($CO_2$) is used as the inert gas. Since the procedure other than the use of carbon dioxide as the inert gas is the same as that according to steps 7B-1 to 7B-3, a description thereof will be omitted.

(C) Film Formation Method by Spin-Coating

A method for forming the insulation film 40 made of an organic SOG film using spin-coating will be described below.

1) First, an insulation film material for forming the organic SOG film is prepared (step 7C-1). In order to obtain such an insulation film material, for example, tetraethoxysilane and methyltriethoxysilane are used as starting materials. The starting materials are subjected to hydrolysis and condensation to produce a polymer. The resulting polymer is used as the insulation film material.

2) Next, the insulation film material obtained in step 7C-1 is applied to the entire surface of the substrate by spin-coating (step 7C-2). The spin-coating is performed, for example, at 3,000 rpm for 30 seconds.

3) Next, heat treatment (soft bake process) is performed (step 7C-3). In the heat treatment, for example, a hot plate (not shown) is used. The heat treatment temperature is, for example, 200° C., and the heat treatment time is, for example, 150 seconds. Thereby, the insulation film 40 made of the organic SOG film is formed.

Furthermore, as the insulation film 40, an inorganic SOG film may be used. In order to form the inorganic SOG film, in step 7C-1 described above, tetraethoxysilane is used as the starting material for the insulation film material. Since the procedure other than the use of tetraethoxysilane as the starting material for the insulation film material is the same as that according to steps 7C-1 to 7C-3, a description thereof will be omitted.

Step 8

Figure 8:
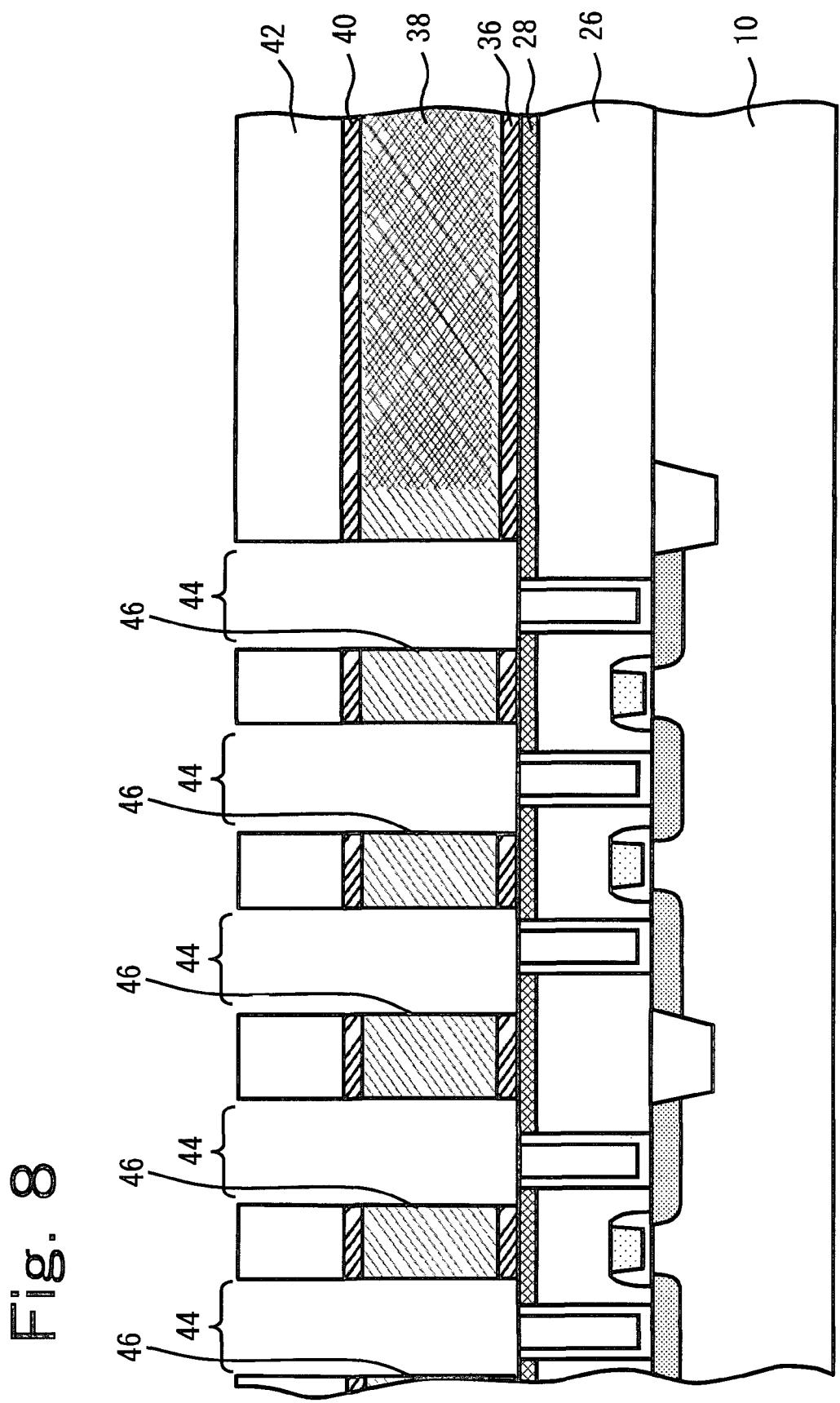
FIG. 8 is a cross-sectional view showing a step in the method for fabricating the semiconductor device (part 6) according to the first embodiment of the present invention.

As shown in FIG. 8, trenches 46 for embedding wires are formed in the insulation film 40, the interlayer insulation film 38, and the insulation film 36 using photolithography. Specifically, for example, the formation is performed in the following manner.

1) First, a photoresist film 42 is formed over the entire surface of the substrate, for example, by spin-coating (step 8-1).

2) Next, openings 44 are formed in the photoresist film 42 using photolithography (step 8-2). The openings 44 are used for forming wires 50 in the first layer (first metal wires). For example, the openings 44 are formed in the photoresist film 42 such that the wiring width is 100 nm and the wiring pitch is 100 nm.

3) Next, using the photoresist film 42 as a mask, the insulation film 40, the interlayer insulation film 38, and the insulation film 36 are etched (step 8-3). The etching is performed using fluorine plasma generated from $CF_4$ gas and $CHF_3$ gas. At this stage, the stopper film 28 functions as an etching stopper. Thereby, the trenches 46 for embedding the wires are formed in the insulation film 40, the interlayer insulation film 38, and the insulation film 36. The upper surfaces of the conductor plugs 34 are exposed to the trenches 46. Then, the photoresist film 42 is removed.

Step 9

Figure 9:
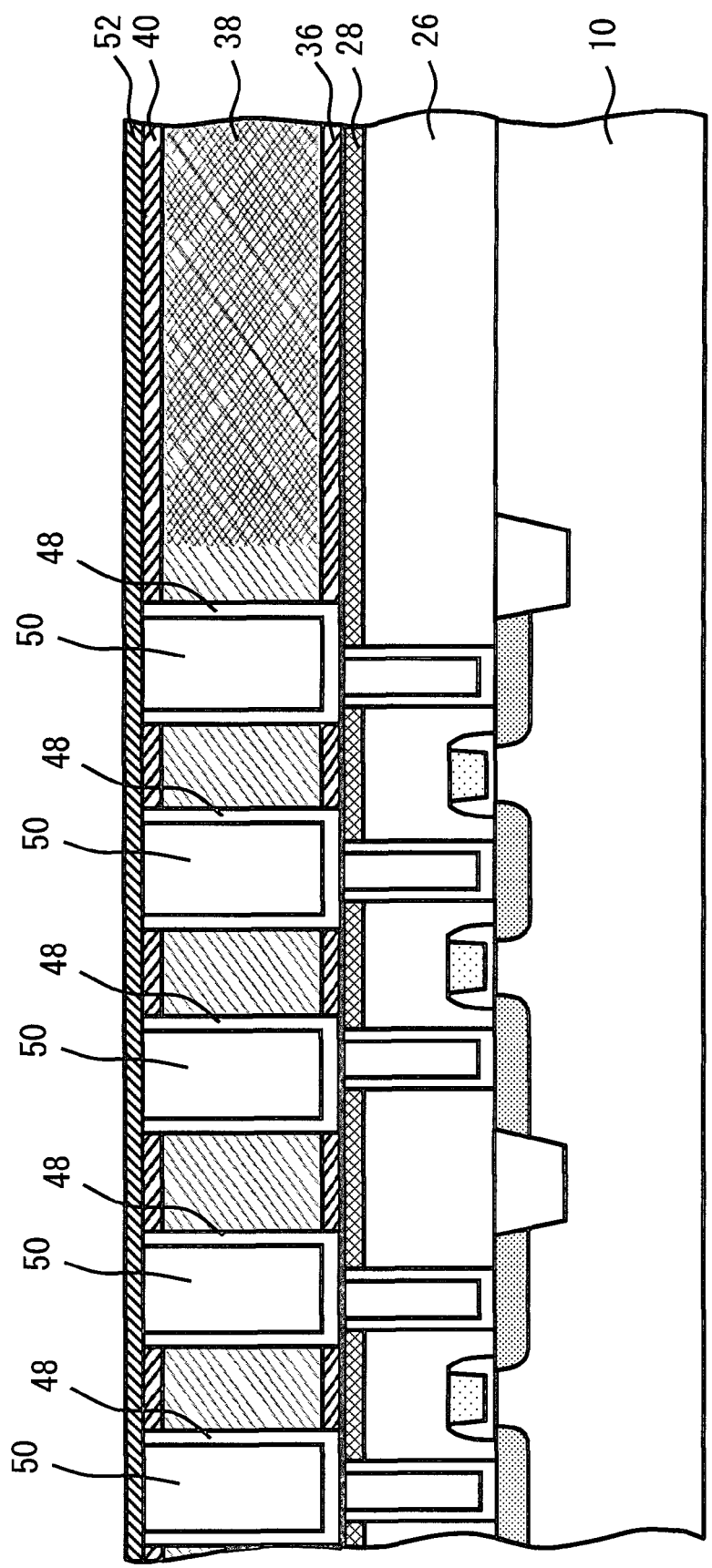
FIG. 9 is a cross-sectional view showing a step in the method for fabricating the semiconductor device (part 7) according to the first embodiment of the present invention.

As shown in FIG. 9, after wires 50 are formed in the trenches 46, an insulation film 52 serving as a barrier film is formed. Specifically, for example, the formation is performed in the following manner.

1) First, a laminated film 48 including a barrier film and a seed film is formed (step 9-1). Specifically, first, a barrier film (not shown) made of TaN with a thickness of 10 nm is formed over the entire surface of the substrate, for example, by sputtering. The barrier film prevents Cu in the wires, which will be described below, from being diffused into the insulation films. Next, a seed film (not shown) made of Cu with a thickness of 10 nm is formed over the entire surface of the substrate, for example, by sputtering. The seed film functions as an electrode when wires made of Cu are formed by electroplating. Thus, the laminated film 48 including the barrier film and the seed film is formed.

2) Next, a Cu film 50 with a thickness of 600 nm is formed, for example, by electroplating (step 9-2).

3) Next, the Cu film 50 and the laminated film 48 are polished, for example, by CMP until the surface of the insulation film is exposed (step 9-3). Thus, the wires 50 made of Cu are embedded in the trenches. Such a process of forming the wires 50 is referred to as a single damascene process.

4) Next, an insulation film 52 made of an oxygen-doped hydrogenated SiC film with a thickness of 30 nm is formed over the entire surface of the substrate, for example, by plasma-enhanced CVD (step 9-4). The insulation film 52 functions as a barrier film that prevents diffusion of moisture. Moisture is prevented from reaching the porous interlayer insulation film 38 by the insulation film 52.

The oxygen-doped hydrogenated SiC film is formed, for example, by the following steps. First, the semiconductor substrate 10 is placed into a chamber of a plasma-enhanced CVD apparatus (not shown) (step 9-4-1). As the plasma-enhanced CVD apparatus, for example, a parallel-plate-type plasma-enhanced CVD apparatus is used. Next, the temperature of the substrate is set, for example, at 400° C. (step 9-4-2). Next, trimethylsilane is vaporized by a vaporizer so as to generate a reactive gas (step 9-4-3). Then, the reactive gas is introduced into the chamber using a carrier gas (step 9-4-4). In this stage, when high-frequency power is applied between plate electrodes (not shown), plasma of the reactive gas is generated.

In this stage, by setting the deposition rate relatively low, it is possible to form a highly dense insulating film 52. Specifically, for example, under the deposition conditions described below, it is possible to form the highly dense insulating film 52. The feed rate of the reactive gas is, for example, 1 mg/min. As the carrier gas, for example, $CO_2$ is used. The flow rate of the carrier gas is, for example, 100 sccm. The high-frequency power applied between plate electrodes is, for example, 13.56 MHz (200 W) and 100 kHz (200 W). The time for applying high-frequency power between plate electrodes to generate plasma is, for example, 5 seconds. Thereby, the insulation film 52 functioning as the barrier film is formed.

Step 10

Figure 10:
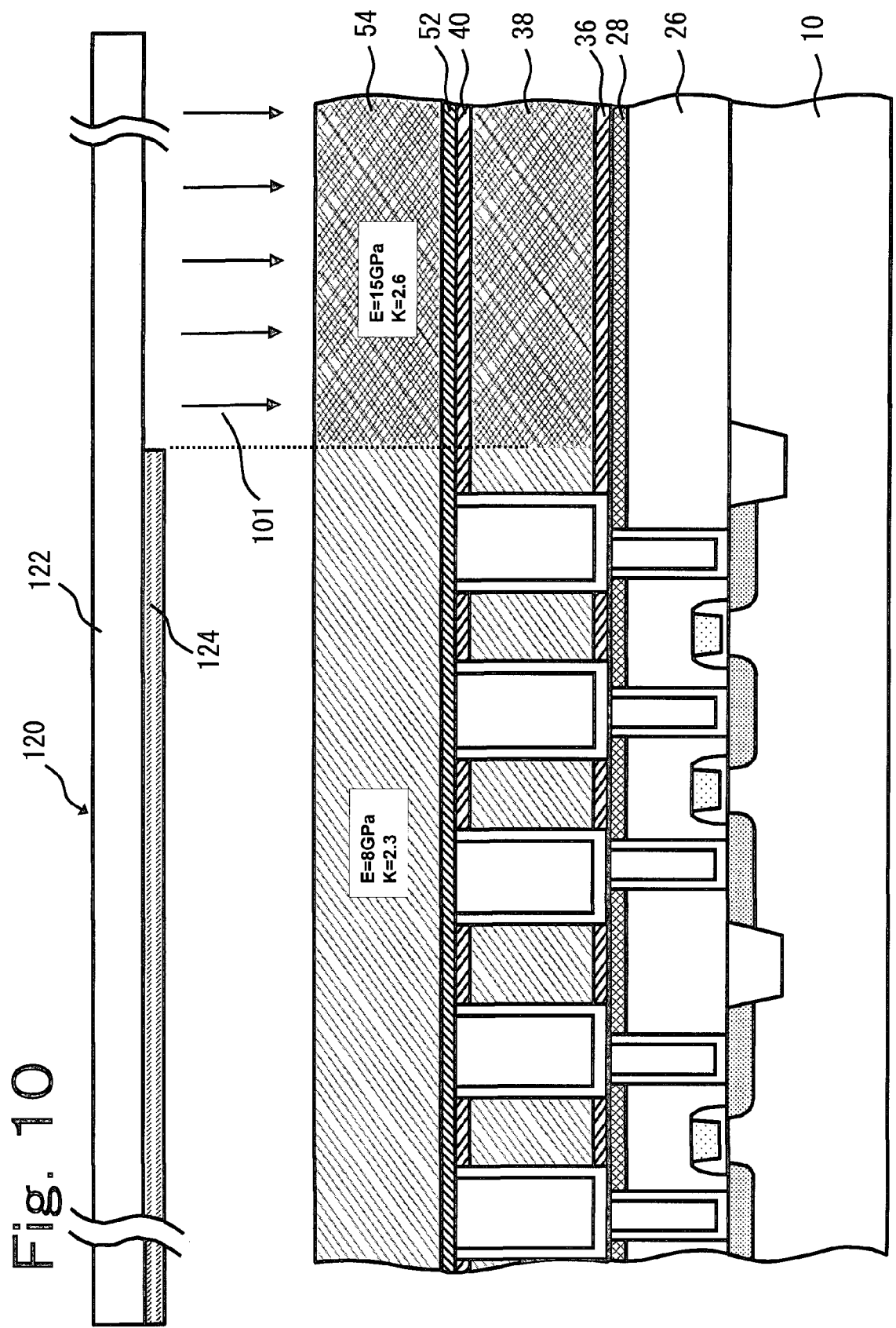
FIG. 10 is a cross-sectional view showing a step in the method for fabricating the semiconductor device (part 8) according to the first embodiment of the present invention.

As shown in FIG. 10, after a porous interlayer insulation film 54 is formed, an energy beam is selectively applied to the interlayer insulation film 54. Specifically, for example, the formation is performed in the following manner.

1) First, the interlayer insulation film 54 is formed. The interlayer insulation film 54 is formed, for example, by the same method as that for forming the interlayer insulation film 38 described above (step $10^{-1}$). The thickness of the interlayer insulation film 54 is, for example, 140 nm.

2) Next, scanning of an electron beam 100 is performed, for example, using the apparatus as shown in FIG. 6, and the "electron beam 100" is selectively applied to the interlayer insulation film 54 (step 10-2). The irradiation of the electron beam 100 is performed under the same conditions as those in the case in which the interlayer insulation film 38 is irradiated with the electron beam 100 (step 6A-3).

Instead of irradiation with the "electron beam 100", irradiation of "ultraviolet light 101" may be performed using a photomask 120 as shown in FIG. 10. That is, the "ultraviolet light 101" is selectively applied to the portion with low wiring density in the porous interlayer insulation film 54. The irradiation of the ultraviolet light 101 is performed under the same conditions as those in the case in which the interlayer insulation film 38 is irradiated with the ultraviolet light 101 (step 6B-3).

As described above, by the selective irradiation of the interlayer insulation film 54 with the energy beam, with respect to the interlayer insulation film 54 including the wiring, the mechanical strength is made uniform and the wiring capacitance is also made uniform.

Step 11

Figure 11:
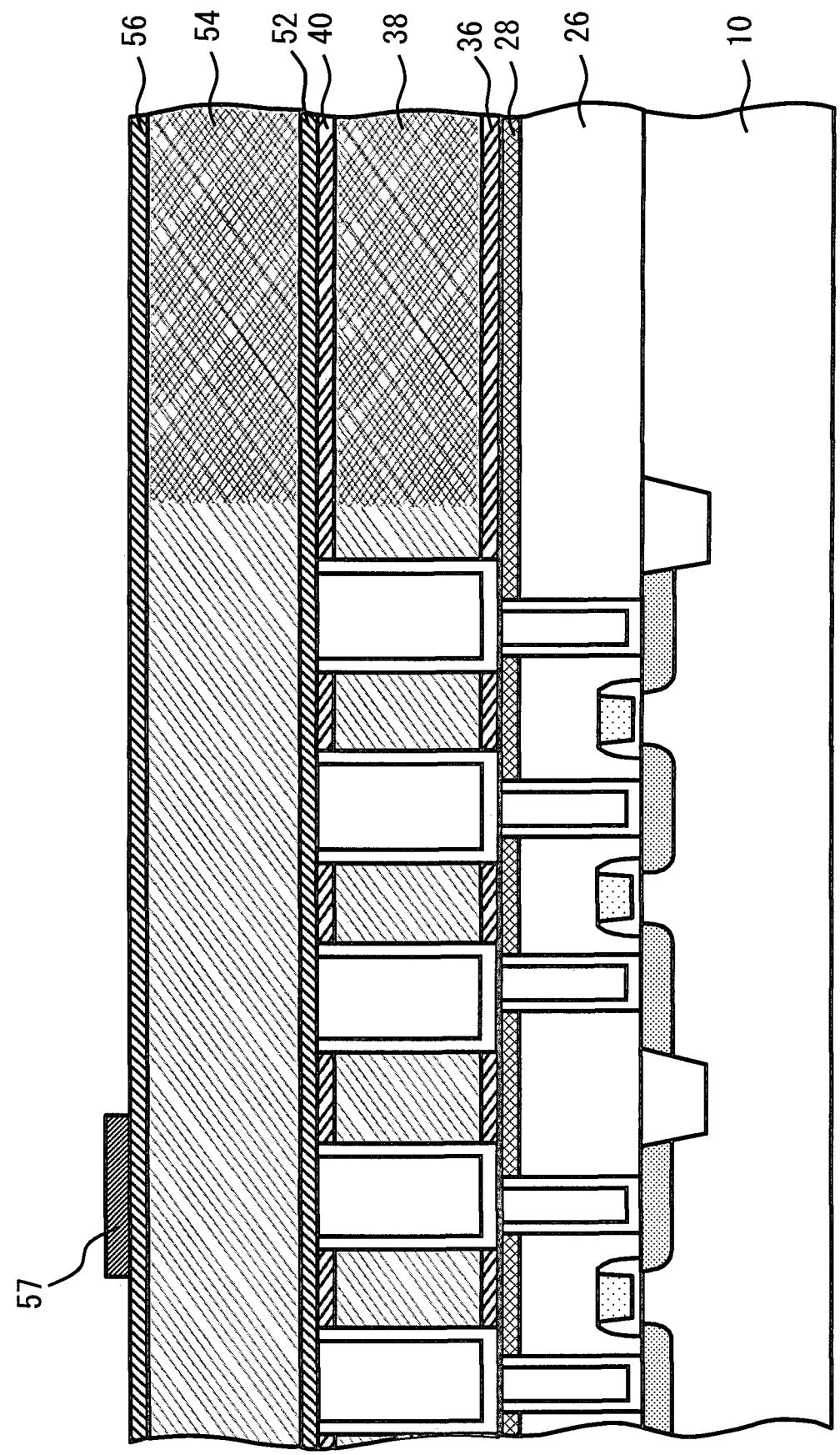
FIG. 11 is a cross-sectional view showing a step in the method for fabricating the semiconductor device (part 9) according to the first embodiment of the present invention.

As shown in FIG. 11, an insulation film 56 and a stopper film 57 are formed on the interlayer insulation film 54. First, the insulation film 56 is formed (step 11-1).

The insulation film 56 is a highly dense film. Specifically, the insulation film 56 is formed over the entire surface of the porous interlayer insulation film 54. The insulation film 56 is formed, for example, by the same method as that for the insulation film 40 described above. As the material for the insulation film 56, for example, an oxygen-doped hydrogenated SiC film is used. The thickness of the insulation film 56 is, for example, 30 nm.

Next, using photolithography, the stopper film 57, for example, made of a silicon nitride film ($SiN_x$) is formed (step 11-2). The stopper film 57 functions as an etching stopper when contact holes 66 are formed in an interlayer insulation film 58, etc. in the step described below. As the stopper film 57, a silicon thermal oxide film ($SiO_2$) or the like that has different etching characteristics from the interlayer insulation film 58, which will be described below, may also be used.

Step 12

Figure 12:
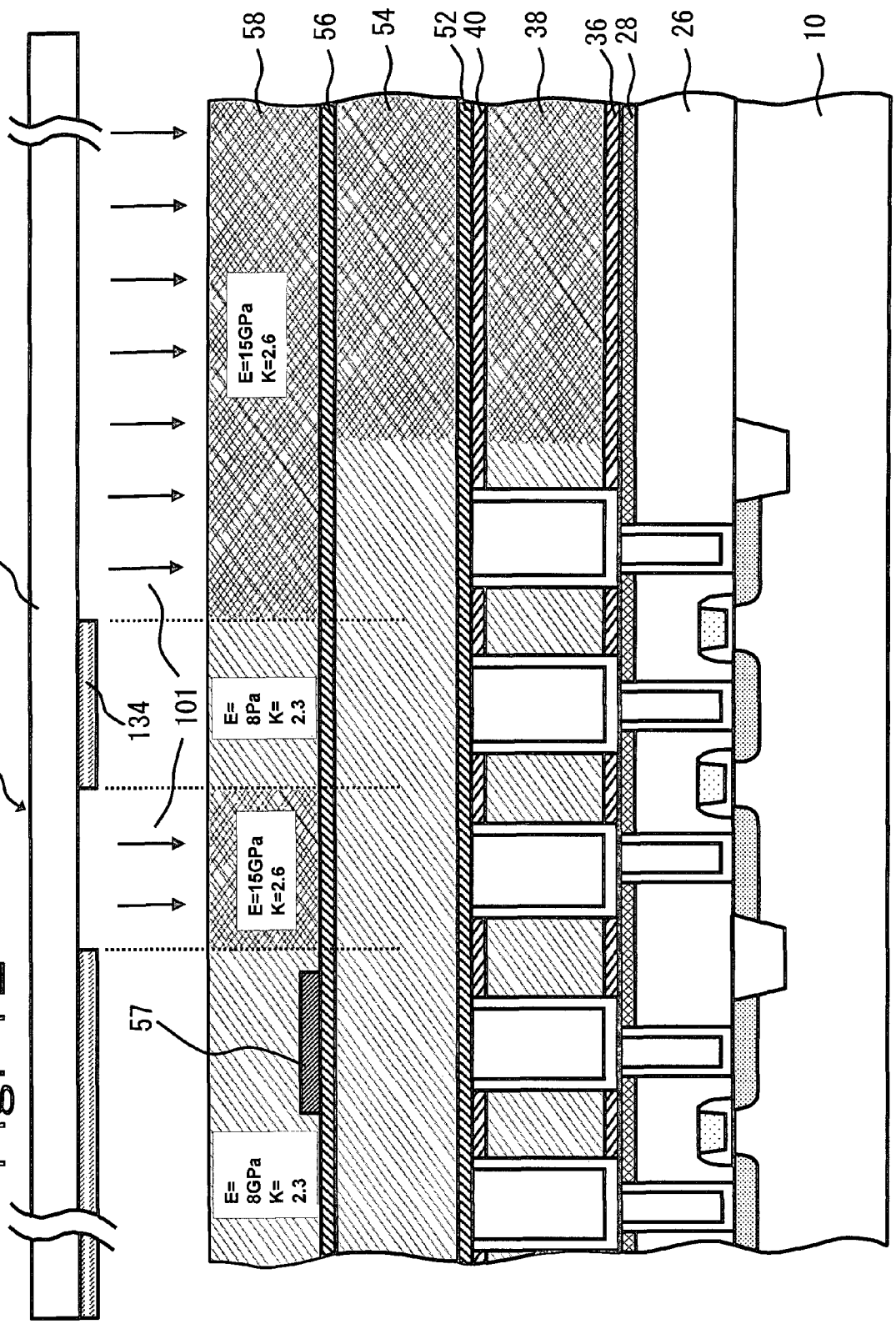
FIG. 12 is a cross-sectional view showing a step in the method for fabricating the semiconductor device (part 10) according to the first embodiment of the present invention.

As shown in FIG. 12, after the porous interlayer insulation film 58 is formed, an energy beam is selectively applied to the interlayer insulation film 58. Specifically, for example, the formation is performed in the following manner.

1) First, the interlayer insulation film 58 is formed. The interlayer insulation film 58 is formed, for example, by the same method as that for forming the interlayer insulation film 38 descried above (step 12-1). The thickness of the interlayer insulation film 58 is, for example, 140 nm.

2) Next, scanning of an electron beam 100 is performed using the apparatus as shown in FIG. 12, and the "electron beam 100" is selectively applied to the interlayer insulation film 58 (step 12-2). The irradiation of the electron beam 100 is performed under the same conditions as those in the case in which the interlayer insulation film 38 is irradiated with the electron beam 100 (step 6A-3). Here, the irradiation of the interlayer insulation film 58 with the electron beam 100 is performed on the basis of the arrangement of wires 76a, which will be described below, and, for example, areas shown in FIG. 12 are irradiated.

Instead of irradiation with the "electron beam 100", irradiation of "ultraviolet light 101" may be performed using a photomask 120 as shown in FIG. 12. That is, the "ultraviolet light 101" is selectively applied to the portion with low wiring density in the porous interlayer insulation film 58. The irradiation of the ultraviolet light 101 is performed under the same conditions as those in the case in which the interlayer insulation film 38 is irradiated with the ultraviolet light 101 (step 6B-3). The irradiation of the interlayer insulation film 58 with the ultraviolet light 101 is performed on the basis of the arrangement of wires 76a, which will be described below, and, for example, areas shown in FIG. 12 are irradiated.

As described above, by the selective irradiation of the interlayer insulation film 58 with the energy beam, with respect to the interlayer insulation film 58 including the wiring, the mechanical strength is made uniform and the wiring capacitance is also made uniform.

Step 13

Figure 13:
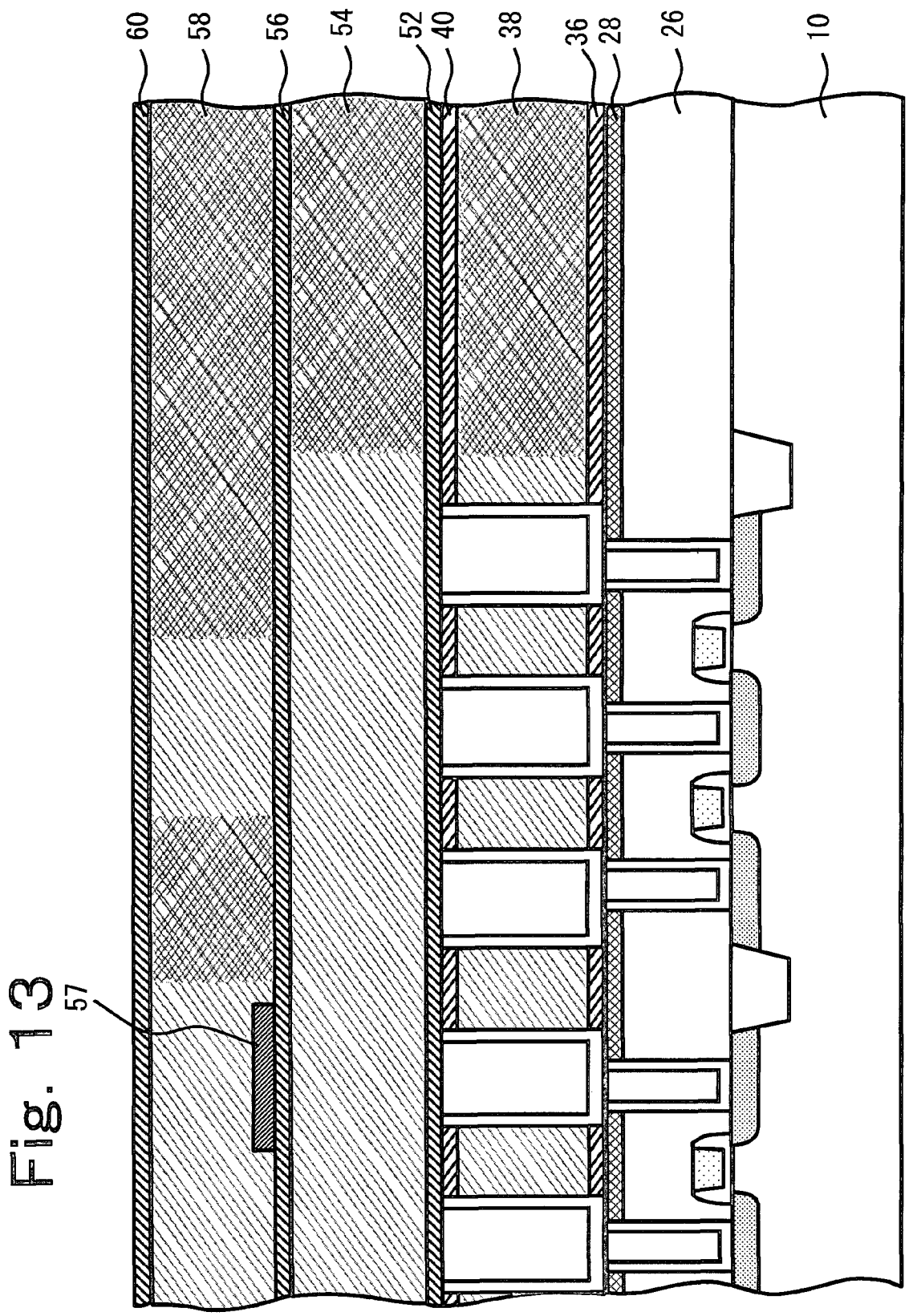
FIG. 13 is a cross-sectional view showing a step in the method for fabricating the semiconductor device (part 11) according to the first embodiment of the present invention.

As shown in FIG. 13, an insulation film 60 is formed on the interlayer insulation film 58. The insulation film 60 is a highly dense film. The insulation film 60 is formed over the entire surface of the interlayer insulation film 58. The insulation film 60 is formed, for example, by the same method as that for the insulation film 40 described above. As the material for the insulation film 60, for example, an oxygen-doped hydrogenated SiC film is used. The thickness of the insulation film 60 is, for example, 30 nm.

Step 14

Figure 14:
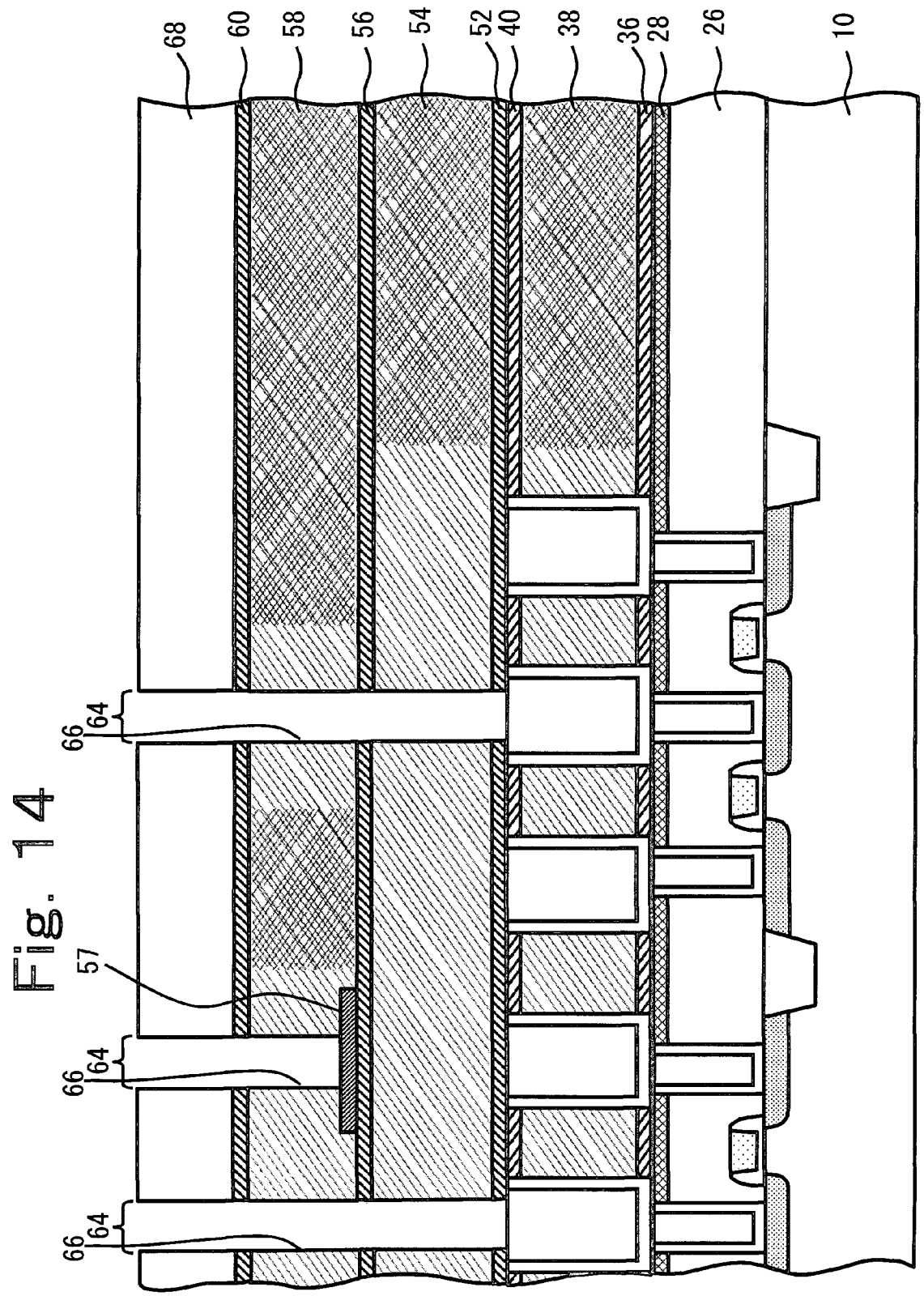
FIG. 14 is a cross-sectional view showing a step in the method for fabricating the semiconductor device (part 12) according to the first embodiment of the present invention.

As shown in FIG. 14, using photolithography, trenches 64 for embedding wires are formed in the insulation films 52, 56, and 60 and the interlayer insulation films 52 and 58. Specifically, for example, the formation is performed in the following manner.

1) First, a photoresist film 62 is formed over the entire surface of the substrate, for example, by spin-coating (step 14-1).

2) Next, openings 64 are formed in the photoresist film 62 using photolithography (step 14-2). The openings 64 are used for forming contact holes 64 that extend to the wires 50.

3) Next, using the photoresist film 62 as a mask, the insulation film 60, the interlayer insulation film 58, the insulation film 56, the interlayer insulation film 54, and the insulation film 52 are etched (step 14-3). The etching is performed using fluorine plasma generated from $CF_4$ gas and $CHF_3$ gas. By appropriately changing the composition ratio of the etching gas, the pressure during etching, and the like, it is possible to perform etching on the insulation film 60, the interlayer insulation film 58, the insulation film 56, the interlayer insulation film 54, and the insulation film 52. Thereby, contact holes 66 that reach the wires 50 are formed. After the contact holes 66 are formed, the photoresist film 62 is removed.

Step 15

Figure 15:
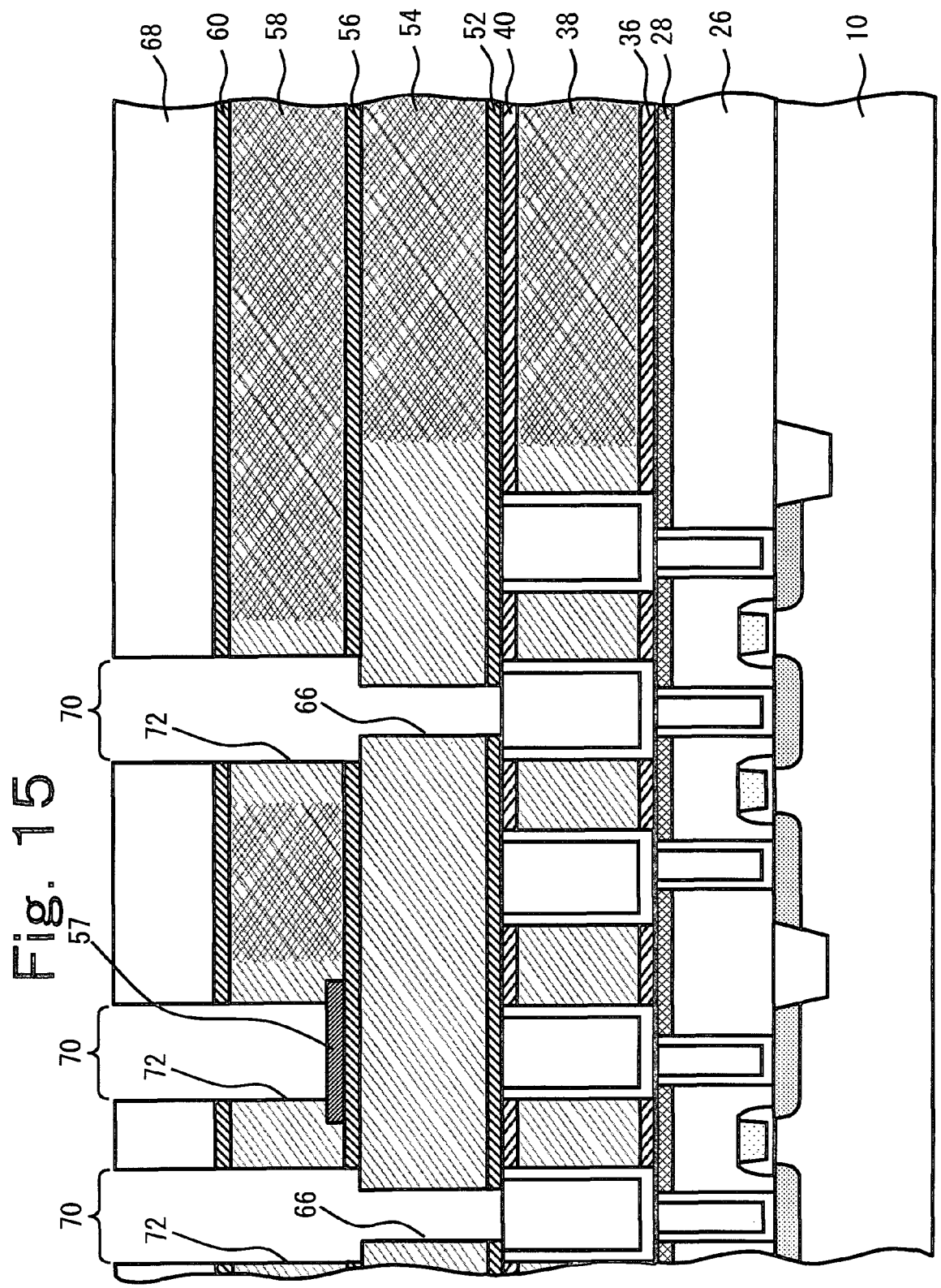
FIG. 15 is a cross-sectional view showing a step in the method for fabricating the semiconductor device (part 13) according to the first embodiment of the present invention.

As shown in FIG. 15, using photolithography, trenches 72 for embedding wires are formed in the insulation film 60, the interlayer insulation film 58, and the insulation film 56. Specifically, for example, the formation is performed in the following manner.

1) First, openings 70 are formed in a photoresist film 68 (step 15-1). The openings 70 are used for forming wires 76a in the second layer (second metal wires), which will be described below.

2) Next, using the photoresist film 68 as a mask, the insulation film 60, the interlayer insulation film 58, and the insulation film 56 are etched (step 15-2). The etching is performed using fluorine plasma generated from $CF_4$ gas and $CHF_3$ gas. Thereby, the trenches 72 for embedding the wires 76a in the insulation film 60, the interlayer insulation film 58, and the insulation film 56 are formed. The trenches 72 are connected to the contact holes 66.

In steps 14 and 15, the example in which the contact holes 66 are formed first, and then the trenches 72 are formed has been described. However, the trenches 72 may be formed first, and then the contact holes 66 may be formed. In such a case, first, using photolithography, trenches 72 are formed in the insulation film 60, the interlayer insulation film 58, and the insulation film 56. Next, a photoresist film (not shown) is formed on the substrate provided with the trenches 72 so as to fill the trenches 72. Then, using photolithography, contact holes that reach the wires 50 are formed in the interlayer insulation film 54 and the insulation film 52. When the contact holes 66 and the trenches 72 are formed by carrying out such a step, the stopper 57 is not required.

Step 16

As shown in FIG. 16, after wires 76a and conductor plugs 76b are formed in the trenches 72, an insulation film that functions as a barrier film is formed. Specifically, for example, the formation is performed in the following manner.

1) First, a laminated film 74 including a barrier film and a seed film is formed (step 16-1). Specifically, first, a barrier film (not shown) made of TaN with a thickness of 10 nm is formed over the entire surface of the substrate, for example, by sputtering. The barrier film prevents Cu in the wires 76a and conductor plugs 76b, which will be described below, from being diffused into the insulation films. Next, a seed film (not shown) made of Cu with a thickness of 10 nm is formed over the entire surface of the substrate, for example, by sputtering. The seed film functions as an electrode when the wires 76a and conductor plugs 76b made of Cu are formed by electroplating. Thus, the laminated film 74 including the barrier film and the seed film is formed.

2) Next, a Cu film 76 with a thickness of 1,400 nm is formed, for example, by electroplating (step 16-2).

3) Next, the Cu film 76 and the laminated film 74 are polished, for example, by CMP until the surface of the insulation film 60 is exposed (step 16-3). Thus, the conductor plugs 76b made of Cu are embedded in the contact holes 66 and the wires 76a made of Cu are embedded in the trenches 72. The conductor plugs 76b and the wires 76a are integrally formed. Such a process in which the conductor plugs 76b and the wires 76a are formed simultaneously is referred to as a dual damascene process.

4) Next, an insulation film 78 made of an oxygen-doped hydrogenated SiC film with a thickness of 30 nm is formed over the entire surface of the substrate, for example, by plasma-enhanced CVD (step 16-4). The insulation film 78 is formed, for example, by the same method as that for forming the insulation film 36 described above (steps 4-1 to 4-3). The insulation film 78 functions as a barrier film that prevents diffusion of moisture. Then, by appropriately repeating the similar steps described above, wires in a third layer (third metal wiring layer), which is not shown, are formed. Thereby, the semiconductor device according to this embodiment is fabricated.

As described above, in this embodiment, after each of the porous interlayer insulation films 38, 54, and 58 is formed, the energy beam is applied to the portion with low wiring density in each of the interlayer insulation films 38, 54, and 58, and thus some area (portion with low wiring density) of each of the porous interlayer insulation films 38, 54, and 58 is cured. On the other hand, the portion with high wiring density in each of the interlayer insulation films 38, 54, and 58 is not irradiated with the electron beam 100 or ultraviolet light 101 so as to maintain its porous property.

Consequently, according to this embodiment, the mechanical strength is increased only in the portions with low wiring density (portions having low mechanical strength and low wiring capacitance) of the interlayer insulation films 38, 54, and 58. Thus, the mechanical strength is made uniform over the entire films. At the same time, the wiring capacitance is increased only in the portions with low wiring density of the interlayer insulation films 38, 54, and 58. Thus, the wiring capacitance is also made uniform over the entire films.

In other words, it is possible to avoid the occurrence of cracks in the interlayer insulation films 38, 54, and 58 when a mechanical stress is applied from outside, for example, during bonding, and thus reliability of the device can be enhanced. It is also possible to maintain low wiring capacitance over the entire device, to increase the signal propagation speed, and to achieve higher performance of the device.

Furthermore, in accordance with this embodiment, it is not necessary to form a plurality of types of insulation film for one interlayer insulation film, and therefore, the fabrication process of the semiconductor device can be simplified.

Second Embodiment

Experiments were made to check the changes in mechanical strength and relative dielectric constant (in porous insulation films) when energy beams are applied to the porous insulation films.

Examples 1 to 3

Cases in which Electron Beams were Irradiated

First, an insulation film material was prepared in the following manner (step V1). Specifically, first, 20.8 g (0.1 mol) of tetraethoxysilane, 17.8 g (0.1 mol) of methyltriethoxysilane, 23.6 g (0.1 mol) of glycidoxypropyltrimethoxysilane, and 39.6 g of methyl isobutyl ketone were placed in a 200-ml reactor (not shown), and 16.2 g of a 1% aqueous solution of tetrabutyl ammonium hydroxide was added dropwise thereto over 10 minutes (step V1-1). After dropping was completed, an aging reaction was carried out for 2 hours (step V1-2). Subsequently, 5 g of magnesium sulfate was added thereto to remove excess moisture (step V1-3). Then, using a rotary evaporator, ethanol generated during the aging reaction was removed so that the total amount of the reaction solution was 50 ml (step V1-4). Methyl isobutyl ketone (20 ml) was added to the resulting reaction solution to give an insulation film material (porous silica precursor) (step V1-5).

Next, the insulation film material prepared in step V1 was applied onto a silicon wafer (semiconductor substrate) by spin-coating (step V2). The coating was performed at a revolution speed of 3,000 rpm with a revolution time of 30 seconds.

Next, using a hot plate, heat treatment (soft bake process) was performed at 200° C. to form a porous interlayer insulation film (step V3). The thickness of the porous insulation film in each example is shown in Table 1 (FIG. 17). The refractive index of the porous insulation film at this stage is also shown in Table 1.

Next, the porous interlayer insulation film was irradiated with an electron beam (step V4). The substrate temperature, acceleration voltage, electron beam irradiation time, and atmosphere in the chamber in this step were set as shown in Table 1.

After curing by electron beam irradiation was performed, the hardness, relative dielectric constant, etc. of the porous interlayer insulation film are measured. The results thereof are shown in Table 1.

Comparative Example

A porous interlayer insulation film was formed as in Examples 1 to 3 except that step V4 (electron beam curing step) was not performed as shown in Table 1.

The resulting interlayer insulation film was measured, and the results shown in Table 1 were obtained. As is evident from Table 1, in Examples 1 to 3, the film thickness is decreased and the elastic modulus and hardness are greatly increased compared with Comparative Example. This makes it possible to assume that the density of the interlayer insulation film is increased by the irradiation of electron beam, and as a result, the elastic modulus and hardness of the interlayer insulation film are greatly increased. Furthermore, it has also been confirmed that the relative dielectric constant is increased by the irradiation of electron beam.

Examples 4 to 6

Cases in which Ultraviolet Light was Irradiated

In each of Examples 4 to 6, a porous interlayer insulation film was formed as in Examples 1 to 3 except that an ultraviolet light curing step was carried out instead of the electron beam curing step in Examples 1 to 3.

The resulting interlayer insulation film was measured, and the results shown in Table 2 (FIG. 18) were obtained. In the case in which ultraviolet light was irradiated, substantially the same results as those in the case in which the electron beam was irradiated were obtained. That is, the elastic modulus and hardness of the interlayer insulation film are greatly increased and the relative dielectric constant of the interlayer insulation film is also increased by the irradiation of ultraviolet light.

As described above, it has been confirmed that the mechanical strength is increased and the relative dielectric constant is also increased by the irradiation of the interlayer insulation film with the energy beam.

Third Embodiment

With respect of a model built on the basis of an actual structure of a semiconductor device, the mechanical strength and relative dielectric constant of the model were obtained by simulation. The results will be shown below.

Figure 20:
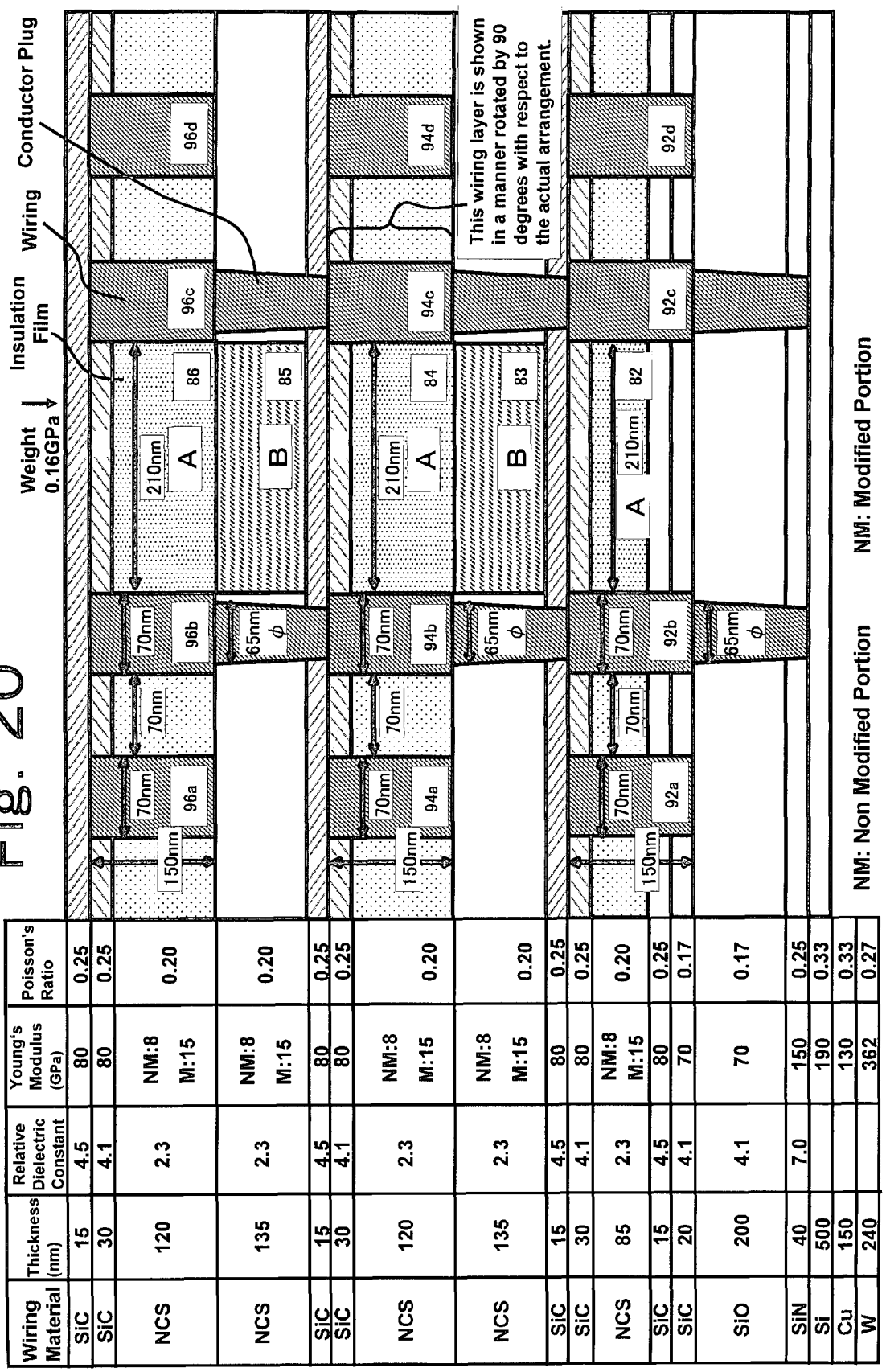
FIG. 20 is a diagram showing conditions for simulation together with a cross-sectional structure.

FIG. 19 shows a structural model of a semiconductor device (conductor plugs and insulation films not subjected to modification are not shown), and FIG. 20 is a diagram showing conditions for simulation together with a cross-sectional structure. FIG. 21 shows the results of simulation performed under the conditions shown in FIG. 20. As shown in FIGS. 19 and 20, principal components of a semiconductor substrate 80 include a silicon substrate 90, wires 92a, 92b, 92c, and 92d (first metal wiring layer), wires 94a, 94b, 94c, and 94d (second metal wiring layer), wires 96a, 96b, 96c, and 96d (third metal wiring layer), and interlayer insulation films 82, 83, 84, 85, and 86.

As shown in FIG. 20, with respect to the interlayer insulation films 82, 83, 84, 85, and 86, the Young's modulus of the portion not modified is 8 Gpa and the Young's modulus of the modified portion is 15 Gpa. A weight of 1.6 Gpa is applied to the substrate from above. In FIG. 20, in order to facilitate the understanding of the arrangement of the wires, the second metal wiring layer is shown in a manner rotated by 90 degrees with respect to the actual arrangement.

As a result of simulation under the conditions shown in FIG. 20, the results shown in Table 3 (FIG. 21) were obtained. Simulation (1) shows the results of simulation in which a wire having the same shape of that of the wire 94b is added to the center of the insulation film 84 shown in FIG. 20. That is, in simulation (1), the case in which the wires were arranged at the minimum wiring pitch so that the wiring density was highest was assumed. With respect to simulations (2) to (4), simulation was performed on the structure shown in FIG. 20.

As is evident from the results shown in Table 3 (FIG. 20), even when all of the interlayer insulation films 82 to 86 are modified, the wiring capacitance is lower than that in simulation (1). Thus, it has been confirmed that even if the interlayer insulation films are modified, there is no problem in actual use. The maximum stress in Table 3 occurs at the interface between the bottom surface of the wire 94b and the conductor post. By modifying the interlayer insulation films as in simulations (3) and (4), the maximum stress is decreased. It is evident from this that the concentration of stress can be reduced by the modification of the interlayer insulation films.

What is claimed is:

1. A semiconductor device comprising:
a substrate;
a single porous insulation film formed on the substrate; and
a plurality of wires embedded in the porous insulation film, the single porous insulation film having a first portion adjacent to the wires and a second portion more remote from the wires than the first portion therefrom, the second portion being spaced apart from the wires, a Young's Modulus of the second portion being higher than that of the first portion so as to substantially reinforce the strength of the single porous insulation film.

2. The semiconductor device according to claim 1, wherein the wires is made of a metal, and the single porous insulation film is made of a silicon oxide film.

3. The semiconductor device according to claim 1, wherein the portion includes the wires arranged at a minimum pitch and spaces between the wires.

4. The semiconductor device according to claim 1, wherein the second portion is more remote from the wires than the first portion therefrom in a cross-section of the single porous insulation film and the wires, the cross-section being parallel to the substrate.

5. The semiconductor device according to claim 4, wherein the first portion includes a fifth portion between the wires disposed at a minimum pitch in the cross-section, and the second portion is disposed at a predetermined distance from the wires in the cross-section, the predetermined distance being set to be a half of the minimum pitch.

6. A semiconductor device comprising:
a substrate;
a single porous insulation film formed on the substrate; and
a plurality of wires embedded in the single porous insulation film, wherein the single porous insulation film has a first area and a second area, the first area having a first wiring density which is a ratio of wires embedded in the first area, the second area having a second wiring density which is a ratio of wires embedded in the second area, the first wiring density being higher than the second wiring density, and a Young's modulus of the first area is lower than that of the second area.

7. The semiconductor device according to claim 6, wherein the first wiring density is higher than a second wiring density in a cross-section of the single porous insulation film and the wires, the cross-section being parallel to the substrate.

* * * * *